(12) United States Patent
Kanaya

(10) Patent No.: US 8,422,015 B2
(45) Date of Patent: Apr. 16, 2013

(54) MOVABLE BODY APPARATUS, PATTERN FORMATION APPARATUS AND EXPOSURE APPARATUS, AND DEVICE MANUFACTURING METHOD

(75) Inventor: Yuho Kanaya, Kumagaya (JP)

(73) Assignee: Nikon Corporation, Tokyo (JP)

(*) Notice: Subject to any disclaimer, the term of this patent is extended or adjusted under 35 U.S.C. 154(b) by 700 days.

(21) Appl. No.: 12/264,450

(22) Filed: Nov. 4, 2008

(65) Prior Publication Data
US 2009/0122286 A1     May 14, 2009

Related U.S. Application Data

(60) Provisional application No. 60/996,297, filed on Nov. 9, 2007.

(51) Int. Cl.
*G01B 11/00* (2006.01)
*G03B 27/42* (2006.01)

(52) U.S. Cl.
USPC .............................. 356/399; 356/616; 355/53

(58) Field of Classification Search .......... 355/53, 355/55, 63, 72; 356/499, 500, 509, 399, 356/614, 615, 616, 624
See application file for complete search history.

(56) References Cited

U.S. PATENT DOCUMENTS

| | | |
|---|---|---|
| 4,215,938 A | 8/1980 | Farrand et al. |
| 5,126,736 A | 6/1992 | Okutani |
| 5,448,332 A | 9/1995 | Sakakibara et al. |
| 5,610,715 A | 3/1997 | Yoshii et al. |
| 5,754,568 A | 5/1998 | Braasch |
| 5,969,441 A | 10/1999 | Loopstra et al. |
| 6,208,407 B1 | 3/2001 | Loopstra |
| 6,590,634 B1 | 7/2003 | Nishi et al. |
| 6,611,316 B2 | 8/2003 | Sewell |
| 6,778,257 B2 | 8/2004 | Bleeker et al. |
| 6,819,425 B2 | 11/2004 | Kwan |
| 6,952,253 B2 | 10/2005 | Lof et al. |

(Continued)

FOREIGN PATENT DOCUMENTS

| | | |
|---|---|---|
| EP | 0 482 553 A2 | 4/1992 |
| EP | 1 420 298 A2 | 5/2004 |

(Continued)

OTHER PUBLICATIONS

Sep. 5, 2010 Written Opinion of the International Search Authority issued in Application No. PCT/JP2008/070637.

(Continued)

*Primary Examiner* — Steven H Whitesell Gordon
(74) *Attorney, Agent, or Firm* — Oliff & Berridge, PLC

(57) ABSTRACT

On the +X and −X sides of a projection unit, a plurality of Z heads are arranged in parallel to the X-axis, by a distance half or less than half the effective width of the Y scale so that two Z heads each constantly form a pair and face a pair of Y scales. Of the pair of heads consisting of two Z heads which simultaneously face the scale, measurement values of a priority head is used, and when abnormality occurs in the measurement values of the priority head due to dust and the like adhering on the scale surface, measurement values of the other head is used, and the positional information of the stage in at least the Z-axis direction is measured in a stable manner and with high precision.

11 Claims, 12 Drawing Sheets

U.S. PATENT DOCUMENTS

| | | | |
|---|---|---|---|
| 7,023,610 B2 | 4/2006 | Ohtsuki et al. | |
| 7,025,498 B2 | 4/2006 | del Puerto | |
| 7,102,729 B2 | 9/2006 | Renkens et al. | |
| 7,161,659 B2 | 1/2007 | Van Den Brink et al. | |
| 7,460,210 B2 | 12/2008 | Park | |
| 8,023,106 B2 * | 9/2011 | Shibazaki et al. | 355/72 |
| 8,054,472 B2 | 11/2011 | Shibazaki | |
| 2003/0025890 A1 | 2/2003 | Nishinaga | |
| 2005/0128461 A1 | 6/2005 | Beems et al. | |
| 2005/0190375 A1 | 9/2005 | Akimoto | |
| 2005/0248856 A1 | 11/2005 | Omura et al. | |
| 2005/0259234 A1 | 11/2005 | Hirukawa et al. | |
| 2005/0280791 A1 | 12/2005 | Nagasaka et al. | |
| 2006/0023178 A1 | 2/2006 | Loopstra et al. | |
| 2006/0023194 A1 | 2/2006 | Loopstra et al. | |
| 2006/0139595 A1 | 6/2006 | Koenen et al. | |
| 2006/0170892 A1 | 8/2006 | Koenen et al. | |
| 2006/0227309 A1 | 10/2006 | Loopstra et al. | |
| 2006/0231206 A1 | 10/2006 | Nagasaka et al. | |
| 2006/0238731 A1 | 10/2006 | Beems et al. | |
| 2006/0238733 A1 | 10/2006 | Beems et al. | |
| 2007/0051160 A1 | 3/2007 | Pril et al. | |
| 2007/0195296 A1 | 8/2007 | Van Der Pasch et al. | |
| 2007/0263191 A1 | 11/2007 | Shibazaki | |
| 2007/0288121 A1 | 12/2007 | Shibazaki | |
| 2008/0043212 A1 | 2/2008 | Shibazaki | |
| 2008/0079920 A1 * | 4/2008 | Hommen et al. | 355/55 |
| 2008/0088843 A1 | 4/2008 | Shibazaki | |
| 2008/0094592 A1 | 4/2008 | Shibazaki | |
| 2008/0094593 A1 | 4/2008 | Shibazaki | |
| 2008/0094604 A1 | 4/2008 | Shibazaki | |
| 2008/0106722 A1 | 5/2008 | Shibazaki | |
| 2008/0218713 A1 | 9/2008 | Shibazaki | |
| 2009/0115982 A1 | 5/2009 | Kanaya | |
| 2009/0122285 A1 | 5/2009 | Kanaya | |
| 2009/0122287 A1 | 5/2009 | Kanaya | |

FOREIGN PATENT DOCUMENTS

| | | |
|---|---|---|
| EP | 1 674 939 A1 | 6/2006 |
| EP | 1 762 897 A1 | 3/2007 |
| EP | 1 983 555 A1 | 10/2008 |
| EP | 2003679 A9 * | 4/2009 |
| JP | A-61-066113 | 4/1986 |
| JP | A-04-265805 | 9/1992 |
| JP | A-6-241720 | 9/1994 |
| JP | A-8-282048 | 10/1996 |
| JP | A-2003-28673 | 1/2003 |
| JP | A-2007-93546 | 4/2007 |
| WO | WO 03/065428 | 8/2003 |
| WO | WO 03/065428 A1 | 8/2003 |
| WO | WO 2005/059617 A2 | 6/2005 |
| WO | WO 2005/059618 A2 | 6/2005 |
| WO | WO 2007/083758 A1 | 7/2007 |
| WO | WO 2007/097379 A1 | 8/2007 |

OTHER PUBLICATIONS

Mar. 3, 2009 International Search Report and Written Opinion issued in Application No. PCT/JP2008/070639.
Mar. 3, 2009 International Search Report and Written Opinion issued in Application No. PCT/JP2008/070638.
Mar. 12, 2009 International Search Report and Written Opinion issued in Application No. PCT/JP2008/070640.
Aug. 1, 2011 Office Action issued in U.S. Appl. No. 12/262,484.
Mar. 6, 2012 Office Action issued in U.S. Appl. No. 12/262,484.
Dec. 22, 2011 Office Action issued in U.S. Appl. No. 12/263,659.
May 25, 2012 Office Action issued in U.S. Appl. No. 12/263,659.
Jun. 30, 2011 Office Action issued in U.S. Appl. No. 12/265,084.
Nov. 17, 2011 Office Action issued in U.S. Appl. No. 12/265,084.
Feb. 1, 2011 Office Action issued in Chinese Application No. 2008800148482 (with English translation).
Chinese Office Action issued Mar. 12, 2012 in Chinese Application No. 200880014027.9 with translation.
Chinese Office Action issued Mar. 19, 2012 in Chinese Application No. 200880014848.2 with translation.
Chinese Office Action issued Apr. 12, 2012 in Chinese Application No. 200880013251.6 with translation.
Office Action issued Jun. 21, 2012 in U.S. Appl. No. 12/265,084.

* cited by examiner

MOVABLE BODY APPARATUS, PATTERN FORMATION APPARATUS AND EXPOSURE APPARATUS, AND DEVICE MANUFACTURING METHOD

CROSS-REFERENCE TO RELATED APPLICATIONS

This non-provisional application claims the benefit of Provisional Application No. 60/996,297 filed Nov. 9, 2007, the disclosure of which is hereby incorporated herein by reference in its entirety.

BACKGROUND OF THE INVENTION

1. Field of the Invention

The present invention relates to movable body apparatus, pattern formation apparatus and exposure apparatus, and device manufacturing methods, and more particularly, to a movable body apparatus equipped with a movable body which substantially moves along a predetermined plane, a pattern formation apparatus which forms a pattern on an object mounted on a movable body, an exposure apparatus which forms a pattern on an object by irradiating an energy beam, and a device manufacturing method which uses the exposure apparatus.

2. Description of the Background Art

Conventionally, in a lithography process for manufacturing microdevices (electron devices) such as semiconductor devices, liquid crystal display devices and the like, exposure apparatuses such as a projection exposure apparatus by a step-and-repeat method (a so-called stepper) and a projection exposure apparatus by a step-and-scan method (a so-called scanning stepper (which is also called a scanner) are mainly used.

However, the surface of a wafer serving as a substrate subject to exposure is not always flat, for example, by undulation and the like of the wafer. Therefore, especially in a scanning exposure apparatus such as a scanner and the like, when a reticle pattern is transferred onto a shot area on a wafer by a scanning exposure method, positional information (focus information) related to an optical axis direction of a projection optical system of the wafer surface is detected at a plurality of detection points set in an exposure area, for example, using a multiple point focal point position detection system (hereinafter also referred to as a "multipoint AF system") and the like, and based on the detection results, a so-called focus leveling control is performed (refer to, for example, U.S. Pat. No. 5,448,332) to control the position in the optical axis direction and the inclination of a table or a stage holding a wafer so that the wafer surface constantly coincides with an image plane of the projection optical system in the exposure area (the wafer surface is within the focal depth of the image plane).

Further, with the stepper or the scanner and the like, wavelength of exposure light used with finer integrated circuits is becoming shorter year by year, and numerical aperture of the projection optical system is also gradually increasing (larger NA), which improves the resolution. Meanwhile, due to shorter wavelength of the exposure light and larger NA in the projection optical system, the depth of focus had become extremely small, which caused a risk of focus margin shortage during the exposure operation. Therefore, as a method of substantially shortening the exposure wavelength while substantially increasing (widening) the depth of focus when compared with the depth of focus in the air, the exposure apparatus that uses the immersion method has recently begun to gather attention (refer to, for example, UPS. Patent Application Publication No. 2005/259234).

However, in the exposure apparatus using this liquid immersion method or other exposure apparatus whose distance (working distance) between the lower end surface of the projection optical system and the wafer is small, it is difficult to place the multipoint AF system in the vicinity of the projection optical system. Meanwhile, in the exposure apparatus, in order to realize exposure with high precision, performing the focus leveling control described above with high precision in a stable manner is required.

SUMMARY OF THE INVENTION

According to a first aspect of the present invention, there is provided a movable body apparatus including a movable body which substantially moves along a predetermined plane, the apparatus comprising: a reflection surface which is arranged at one of the movable body and the outside of the movable body, with a first direction within a plane parallel to the predetermined plane serving as a longitudinal direction, and having a predetermined width in a second direction orthogonal to the first direction; a measurement device which has a plurality of measurement points placed in a movement area of the movable body, and of the plurality of measurement points that the measurement device has, n points (wherein, n is an integer of two or more) or more are set to be positioned within the predetermined width on the reflection surface, while n+1 points or more are set to be positioned within the predetermined width on the reflection surface when the movable body is at a predetermined position, and measures the positional information of the reflection surface in a third direction orthogonal to the predetermined plane by irradiating measurement beams on measurement points placed on the reflection surface within the predetermined width; and a controller which performs position control of the movable body, preferentially using a first measurement information including measurement information at a first measurement point out of the n points or more measurement points positioned within the predetermined width of the reflection surface or the n+1 or more measurement points positioned within the predetermined width on the reflection surface when the movable body is at the predetermined position, and switches measurement information to preferentially use in position control of the movable body to a second measurement information including measurement information at a second measurement point which is different from the first measurement point when abnormality occurs in the measurement information at the measurement point positioned within the predetermined width of the reflection surface due to abnormality of the reflection surface.

According to this apparatus, of the plurality of measurement points that the measurement device has, n points (wherein, n is an integer of two or more) or more are positioned within the predetermined width on the reflection surface, and when the movable body is at a predetermined position, n+1 points or more are positioned within the predetermined width on the reflection surface. Therefore, it becomes possible to measure positional information of the movable body in the third direction orthogonal to the predetermined plane in at least one measurement point. Further, even if abnormality occurs in a part of the measurement information of n points positioned within the predetermined width on the reflection surface or n+1 points when the movable body is at the predetermined position, due to abnormality of the reflection surface, the controller switches measurement information to preferentially use in position control of the movable body to a second measurement information including measurement information at a second measurement point which is different from the first measurement point. Accordingly, it becomes possible to measure positional information of the movable body unfailingly in the third direction.

According to a second aspect of the present invention, there is provided a movable body apparatus including a movable body which substantially moves along a predetermined plane, the apparatus comprising: a reflection surface which is arranged at one of the movable body and the outside of the movable body, with a first direction within a plane parallel to the predetermined plane serving as a longitudinal direction, and having a predetermined width in a second direction orthogonal to the first direction; a measurement device which has a plurality of measurement points placed in a movement area of the movable body, and measures positional information of the reflection surface in a third direction orthogonal to the predetermined plane at the plurality of measurement points, and also has a plurality of head sets including a first head which irradiates a measurement beam on a first measurement point and a second head which irradiates a measurement beam on the first measurement point or in its vicinity; and a controller which controls a position of the movable body preferentially using measurement information generated by the first head, and also switches the measurement information preferentially used from the measurement information generated by the first head to measurement information generated by the second head in the case abnormality occurs in the measurement information generated by the first head due to abnormality occurring in the reflection surface.

According to this apparatus, the measurement device has a plurality of head sets including a first head which irradiates a measurement beam on a first measurement point of the plurality of measurement points, and a second head which irradiates a measurement beam on the first measurement point or in its vicinity. Further, of the first head and the second head included in the head set, in the case abnormality occurs in the measurement information of one of the heads due to abnormality in the reflection surface, the controller switches the measurement information preferentially used from the measurement information generated by the first head to measurement information generated by the second head. Accordingly, by using the measurement device which has the plurality of head sets, it becomes possible to unfailingly measure the positional information of the movable body in the third direction.

According to a third aspect of the present invention, there is provided a movable body which substantially moves along a predetermined plane, the apparatus comprising: a reflection surface which is arranged at one of the movable body and the outside of the movable body, with a first direction within a plane parallel to the predetermined plane serving as a longitudinal direction, and having a predetermined width in a second direction orthogonal to the first direction; and a measurement device which measures positional information of the movable body in a direction orthogonal to the predetermined plane at a plurality of measurement points placed in a movement range of the movable body, and also has a plurality of heads which generate measurement information by irradiating a measurement beam on at least one of the plurality of measurement points when the movable body is located at a predetermined position; and a controller which controls a position of the movable body preferentially using measurement information generated by the first head of the plurality of heads irradiating measurement beams on the one measurement point, and also switches the measurement information preferentially used from the measurement information generated by the first head to measurement information generated by the second head of the plurality of heads in the case abnormality occurs in the measurement information generated by the first head due to abnormality of the reflection surface.

According to this apparatus, the measurement device has a plurality of heads which generate measurement information by irradiating a measurement beam on at least one of the plurality of measurement points when the movable body is located at a predetermined position. Therefore, it becomes possible to measure positional information of the movable body in the third direction orthogonal to the predetermined plane in at least one measurement point. Further, the controller switches the measurement information preferentially used from the measurement information generated by the first head to measurement information generated by the second head of the plurality of heads in the case abnormality occurs in the measurement information generated by the first head due to abnormality of the scale. Therefore, it becomes possible to measure positional information of the movable body unfailingly in the third direction.

According to a fourth aspect of the present invention, there is provided a pattern formation apparatus that forms a pattern on an object, the apparatus comprising: a patterning device which forms a pattern on the object, and the movable body apparatus according to the present invention (to be precise, any one of the firsts second, or third movable body apparatus) in which the object is mounted on the movable body.

According to this apparatus, a pattern is generated by the patterning device on the object, which is on a movable body that configures a part of the movable body apparatus of the present invention and can unfailingly measure the positional information in the measurement direction. Accordingly, it becomes possible to form a pattern on the object with good precision.

According to a fifth aspect of the present invention, there is provided an exposure apparatus that forms a pattern on an object by irradiating an energy beam, the apparatus comprising: a patterning device that irradiates the energy beam on the object; the movable body apparatus according to the present invention in which the object is mounted on the movable body, and a driver which drives the movable body to make the object relatively move with respect to the energy beam.

According to this apparatus, to make the object relatively move with respect to the energy beam irradiated on the object from the patterning device, the driver drives the movable body on which the object is mounted with good precision. Accordingly, it becomes possible to form a pattern on the object with good precision by scanning exposure.

According to a sixth aspect of the present invention, there is provided a device manufacturing method which uses the exposure apparatus according to the present invention.

BRIEF DESCRIPTION OF THE DRAWINGS

In the accompanying drawings;

FIG. 4 is a view showing a placement of various measurement systems which the exposure apparatus in FIG. 1 is equipped with;

DESCRIPTION OF THE EMBODIMENTS

An embodiment of the present invention will be described below, with reference to FIGS. 1 to 9C.

Figure 1:
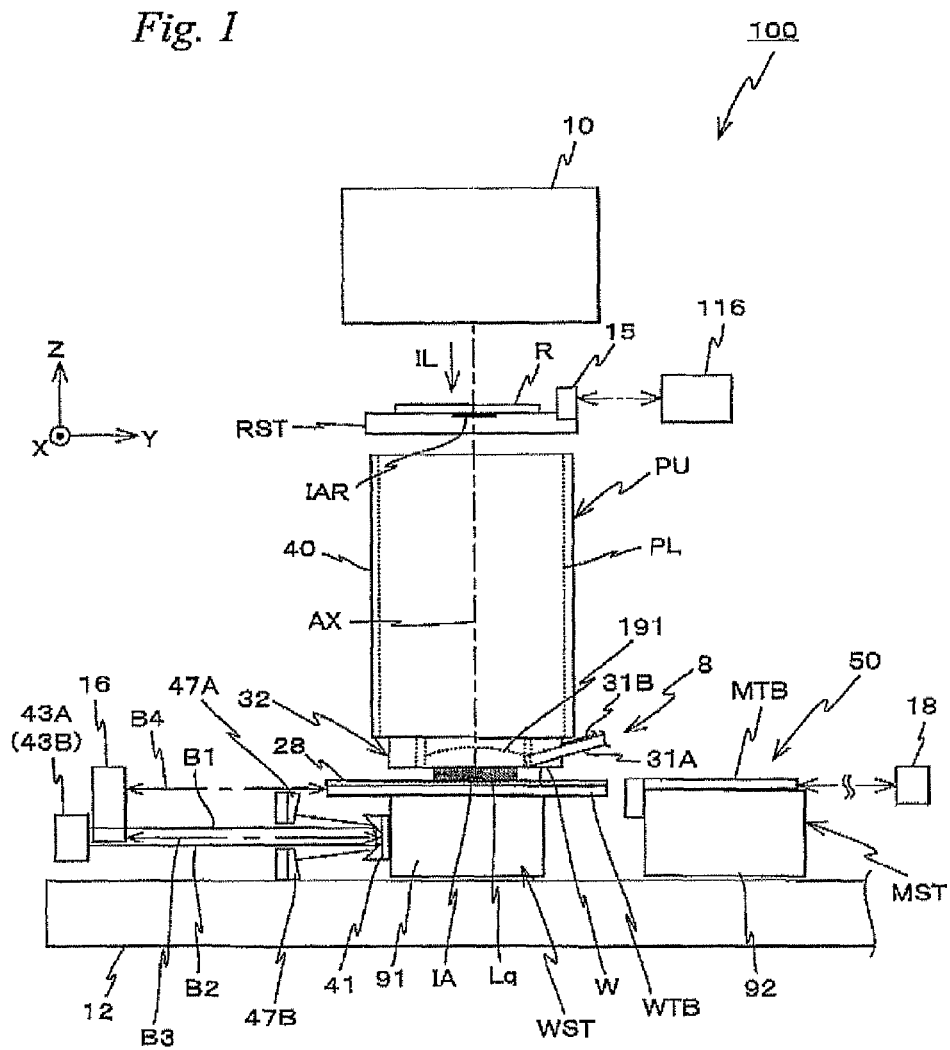
FIG. 1 is a view schematically showing the configuration of an exposure apparatus related to an embodiment.

FIG. 1 shows a schematic configuration of an exposure apparatus 100 in the embodiment. Exposure apparatus 100 is a projection exposure apparatus by the step-and-scan method, or a so-called scanner. As discussed later on, in the embodiment, a projection optical system PL is arranged, and in the description below, a direction parallel to an optical axis AX of projection optical system Pt will be described as the Z-axis direction, a direction within a plane orthogonal to the Z-axis direction in which a reticle and a wafer are relatively scanned will be described as the Y-axis direction, a direction orthogonal to the Z-axis and the Y-axis will be described as the X-axis direction, and rotational (inclination) directions around the X-axis, the Y-axis, and the Z-axis will be described as θx, θy, and θz directions, respectively.

Exposure apparatus 100 is equipped with an illumination system 10, a reticle stage RST, a projection unit PU, a stage device 50 having a wafer stage WST and a measurement stage MST, and a control system of these parts. Although a part of the configuration is different such as the configuration of the encoder system which will be described later on, as a whole, exposure apparatus 100 is configured similar to the exposure apparatus disclosed in the pamphlet of International Publication No. 2007/097379 (and the corresponding U.S. Patent Application Publication No. 2008/0088843) previously described. Accordingly, in the description below, the explanation given for each component will be simplified, except when especially necessary. Incidentally, in FIG. 1, a wafer W is mounted on wafer stage WST.

Illumination system 10 includes a light source, an illuminance uniformity optical system, which includes an optical integrator and the like, an illumination optical system that has a reticle blind and the like (none of which are shown), as is disclosed in, for example, U.S. Patent Application Publication No. 2003/0025890 and the like. Illumination system 10 illuminates a slit-shaped illumination area IAR, which is set on reticle R with a reticle blind (a masking system), by an illumination light (exposure light) IL with a substantially uniform illuminance. In this case, as illumination light IL, for example, an ArF excimer laser beam (wavelength 193 nm) is used.

On reticle stage RST, reticle R on which a circuit pattern or the like is formed on its pattern surface (the lower surface in FIG. 1) is fixed, for example, by vacuum chucking. Reticle stage RST is finely drivable within an XY plane, for example, by a reticle stage drive section 11 (not shown in FIG. 1, refer to FIG. 7) that includes a linear motor or the like, and reticle stage RST is also drivable in a scanning direction (in this case, the Y-axis direction, which is the lateral direction of the page surface in FIG. 1) at a predetermined scanning speed.

The positional information (including rotation information in the θz direction) of reticle stage RST in the XY plane (movement plane) is constantly detected, for example, at a resolution of around 0.25 nm by a reticle laser interferometer (hereinafter referred to as a "reticle interferometer") 116, via a movable mirror 15 (the mirrors actually arranged are a Y movable mirror (or a retro reflector) that has a reflection surface which is orthogonal to the Y-axis direction and an X movable mirror that has a reflection surface orthogonal to the X-axis direction). The measurement values of reticle interferometer 116 are sent to a main controller 20 (not shown in FIG. 1, refer to FIG. 7).

Projection unit PU is placed below reticle stage RST in FIG. 1. Projection unit PU includes a barrel 40, and projection optical system PL that has a plurality of optical elements which are held in a predetermined positional relation inside barrel 40. As projection optical system PL, for example, a dioptric system is used, consisting of a plurality of lenses (lens elements) that is disposed along an optical axis AX, which is parallel to the Z-axis direction. Projection optical system PL is, for example, a both-side telecentric dioptric system that has a predetermined projection magnification (such as one-quarter, one-fifth, or one-eighth times). Therefore, when illumination light IL from illumination system 10 illuminates illumination area IAR, illumination light IL that has passed through reticle R which is placed so that its pattern surface substantially coincides with a first plane (an object plane) of projection optical system PL forms a reduced image of the circuit pattern (a reduced image of a part of the circuit pattern) of reticle R formed within illumination area IAR, via projection optical system PL (projection unit PU), in an area (hereinafter, also referred to as an exposure area) IA conjugate to illumination area IAR on wafer W whose surface is coated with a resist (a sensitive agent) and is placed on a second plane (an image plane) side of projection optical system PL. And by reticle stage RST and wafer stage WST being synchronously driven, reticle R is relatively moved in the scanning direction (the Y-axis direction) with respect to illumination area IAR (illumination light IL) while wafer W is relatively moved in the scanning direction (the Y-axis direction) with respect to exposure area IA (illumination light IL), thus scanning exposure of a shot area (divided area) on wafer N is performed, and the pattern of reticle R is transferred onto the shot area That is in the embodiment, the pattern is generated on wafer W according to illumination system 10, reticle R, and projection optical system PL, and then by the exposure of the sensitive layer (resist layer) on wafer W with illumination light IL, the pattern is formed on wafer W.

Figure 4:
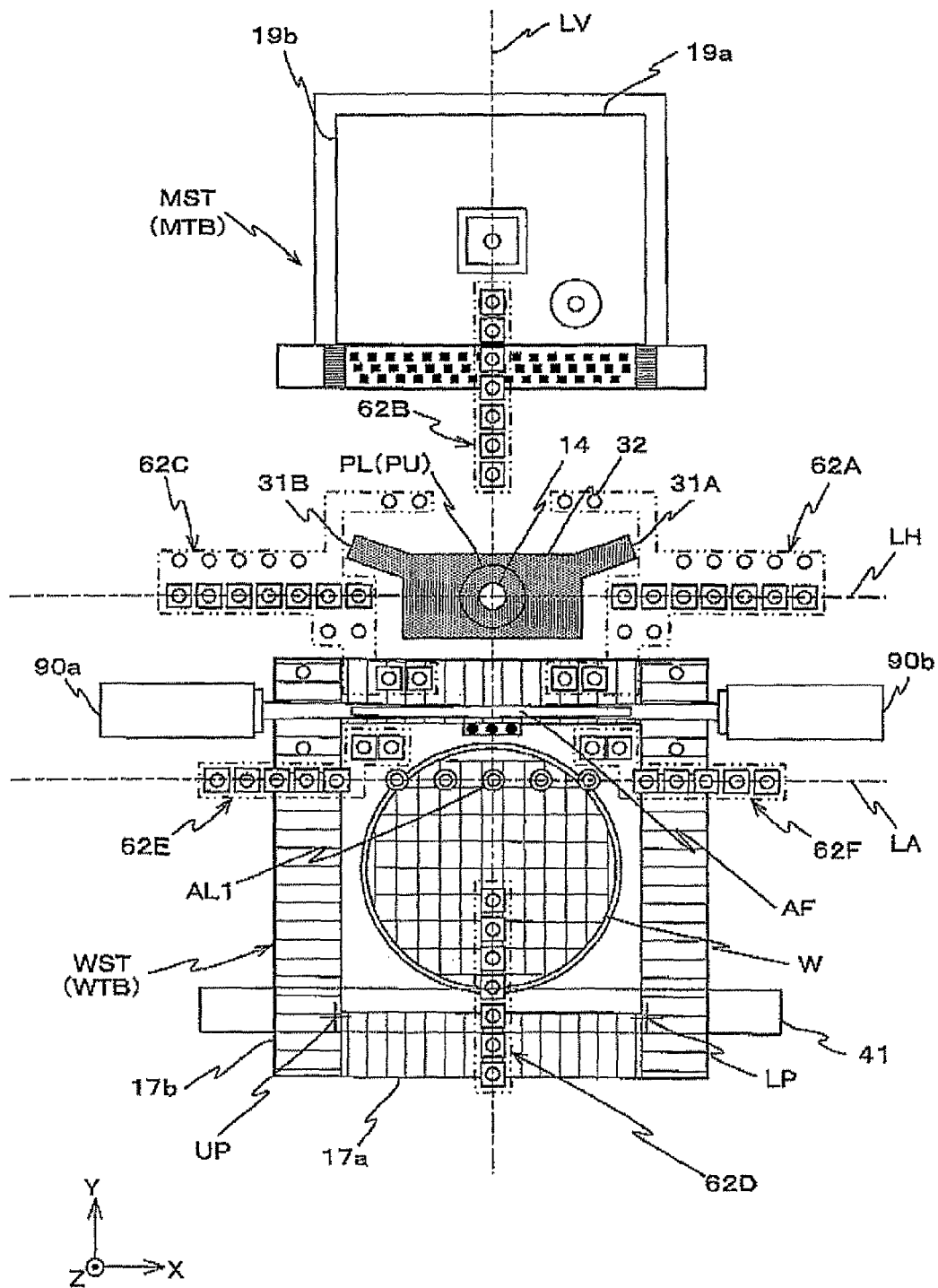

In exposure apparatus 100 of the embodiment, a local liquid immersion device a is installed to perform exposure by a liquid immersion method. Local liquid immersion device 8 includes a liquid supply device 5, a liquid recovery device 6 (both of which are not shown in FIG. 1, refer to FIG. 7), a liquid supply pipe 31A, a liquid recovery pipe 31B, a nozzle unit 32 and the like. As shown in FIG. 1, nozzle unit 32 is supported in a suspended state by a mainframe (not shown) holding projection unit PU, so that the periphery of the lower end portion of barrel 40 that holds an optical element closest to the image plane side (the wafer W side) constituting projection optical system PL, in this case, a lens (hereinafter also referred to as a tip lens) 191, is enclosed. In the embodiment, as shown in FIG. 1, nozzle unit 32 is set so that its lower end surface is on a substantially flush surface with the lower end surface of tip lens 191. Further, nozzle unit 32 is equipped with a supply opening and a recovery opening of liquid Lq, a lower surface to which wafer W is placed facing and at which the recovery opening is arranged, and a supply flow channel and a recovery flow channel that are connected to a liquid supply pipe 31A and a liquid recovery pipe 31B respectively. Liquid supply pipe 31A and liquid recovery pipe 31B are slanted by around 45 degrees relative to an X-axis direction and Y-axis direction in a planar view (when viewed from above) as shown in FIG. 4, and are placed symmetric to a straight line (a reference axis) LV which passes through the center (optical axis AX of projection optical system PT, coinciding with the center of exposure area IA previously described in the embodiment) of projection unit PU and is also parallel to the Y-axis.

Figure 7:
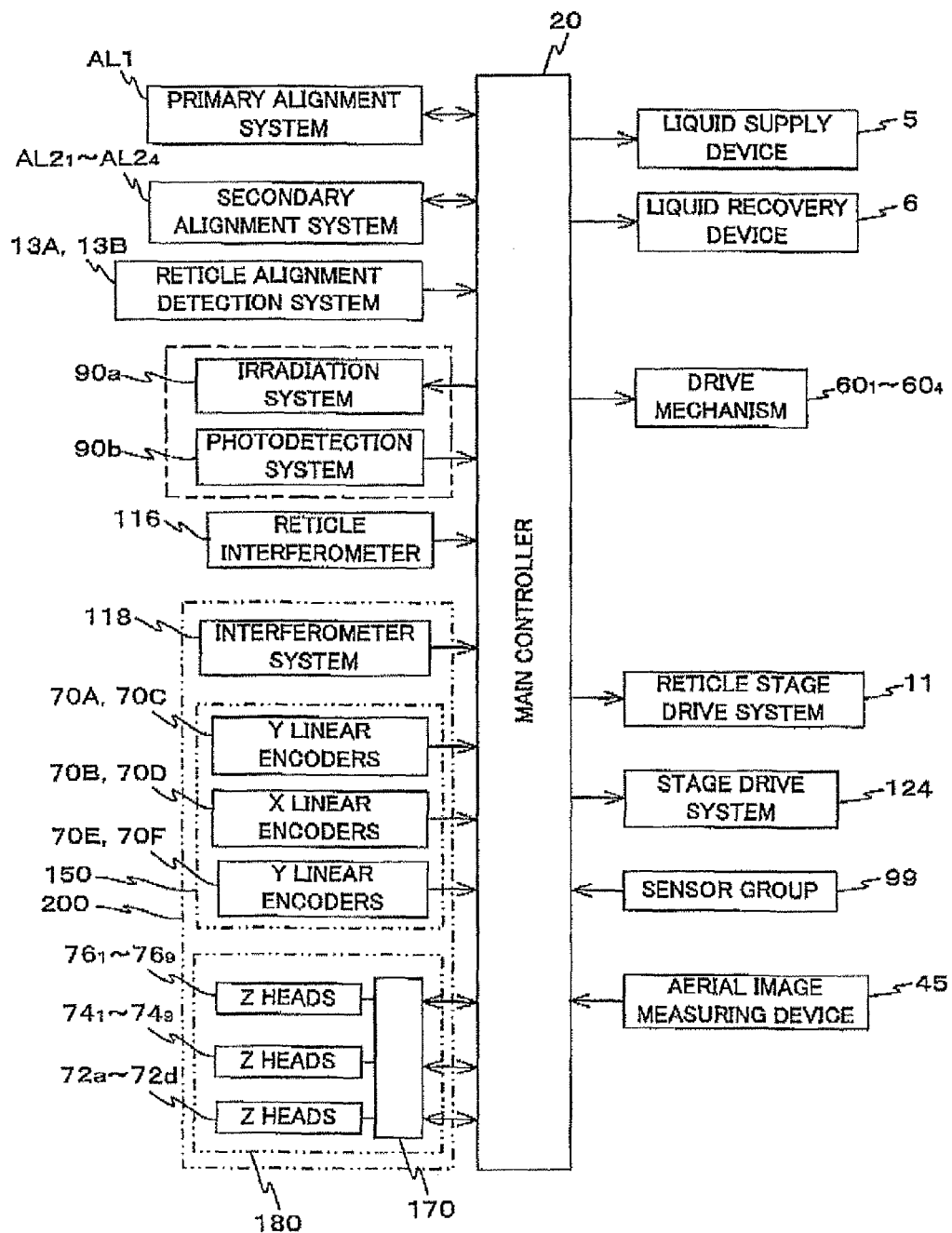
FIG. 7 is a block diagram showing a main configuration of a control system of the exposure apparatus in FIG. 1.

Liquid supply pipe 31A connects to liquid supply device 5 (not shown in FIG. 1, refer to FIG. 7), and liquid recovery pipe 31B connects to liquid recovery device 6 (not shown in FIG. 1, refer to FIG. 7). In this case, in liquid supply device 5, a tank to store the liquid, a compression pump, a temperature controller, a valve for controlling the flow amount of the liquid, and the like are equipped. In liquid recovery device 6, a tank to store the liquid which has been recovered, a suction pump, a valve for controlling the flow amount of the liquid, and the like are equipped.

Main controller 20 controls liquid supply device 5 (refer to FIG. 7), and supplies liquid between tip lens 191 and wafer W via liquid supply pipe 31A, as well as control liquid recovery device 6 (refer to FIG. 7), and recovers liquid from between tip lens 191 and wafer W via liquid recovery pipe 31B. During the operations, main controller 20 controls liquid supply device 5 and liquid recovery device 6 so that the quantity of liquid supplied constantly equals the quantity at water which has been recovered. Accordingly, in the space between tip lens 191 and wafer W, a constant quantity of liquid Lq (refer to FIG. 1) is held constantly replaced, and by this, a liquid immersion area 14 (for example, refer to FIG. 8) is formed. Incidentally, in the case measurement stage MST which will be described later on is positioned below projection unit PU, liquid immersion area 14 can be formed similarly in the space between tip lens 191 and a measurement table described later on.

In the embodiment, as the liquid described above, pure water (hereinafter, it will simply be referred to as "water" besides the case when specifying is necessary) that transmits the ArF excimer laser light (light with a wavelength of 193 nm) is to be used. Incidentally, refractive index n of the water with respect to the ArF excimer laser light is around 1.44. In the water the wavelength of illumination light IL is 193 nm×1/n, shorted to around 134 nm.

As shown in FIG. 1, stage device 50 is equipped with a wafer stage WST and a measurement stage MST placed above a base board 12, a measurement system 200 (refer to FIG. 7) which measures positional information of the stages WST and MST, a stage drive system 124 (refer to FIG. 7) which drives stages WST and MST and the like. Measurement system 200 includes an interferometer system 118, an encoder system 150 and a surface position measurement system 180 as shown in FIG. 7. Incidentally, details on interferometer system 118, encoder system 150 and the like will be described later in the description.

Wafer stage WST and measurement stage MST are supported above base board 12, via a clearance of around several μm by a plurality of noncontact bearings (not shown) fixed to each of the bottom surfaces, such as, for example, air pads. Further, stages WST and MST are drivable independently within the XY plane, by stage drive system 124 (refer to FIG. 7) which includes a linear motor and the like.

Wafer stage WST includes a stage main section 91, and a wafer table WTB that is mounted on stage main section 91. Wafer table WTB and stage main section 91 are configured drivable in directions of six degrees of freedom (X, Y, Z, θx, θy, and θz) with respect to base board 12 by a drive system including a linear motor and a Z leveling mechanism (including a voice coil motor and the like).

Figure 2A:
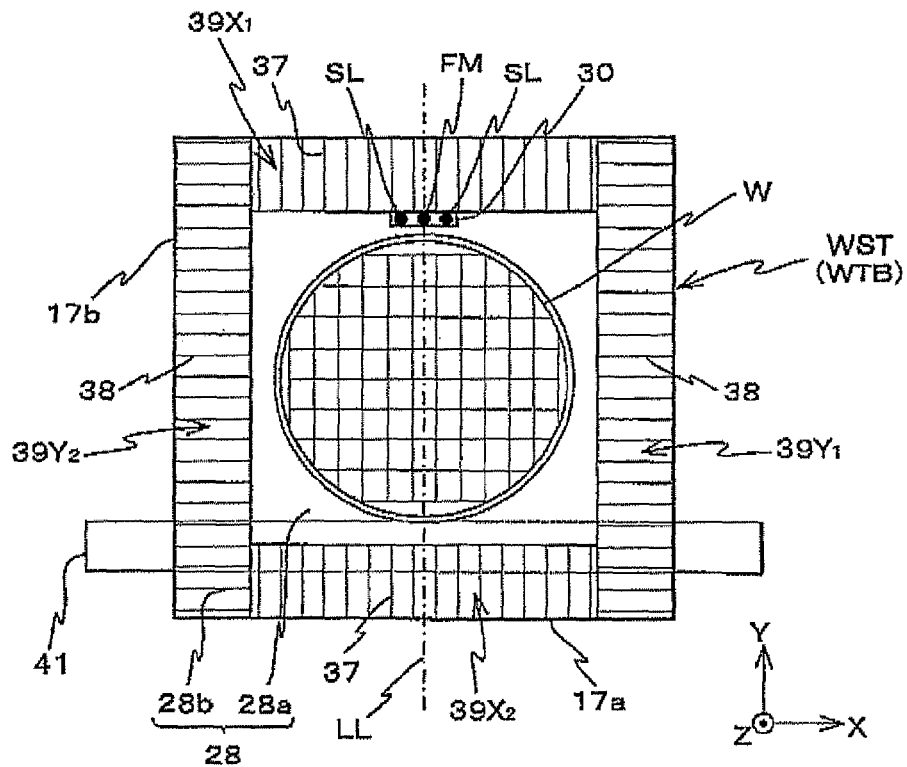
FIG. 2A is a planar view showing a wafer stage.

In the center of the upper surface of wafer table WTB, a wafer holder (not shown) is arranged which holds wafer W by vacuum suction or the like. On the outer side of the wafer holder (mounting area of the wafer), as shown in FIG. 2A, a plate (a liquid repellent plate) 28 is arranged that has a circular opening one size larger than the wafer holder formed in the center, and also has a rectangular outer shape (contour). A liquid repellent treatment against liquid Lq is applied to the surface of plate 28 (a liquid repellent surface is formed). Incidentally, plate 28 is installed on the wafer table WTB upper surface, so that its entire surface or a part of the surface becomes flush with the surface of wafer W.

Plate 28 has a first liquid repellent area 28a having a rectangular outer shape (contour) with the circular opening described above formed in the center, and a second liquid repellent area 28b having a rectangular frame (loop) shape placed around the first liquid repellent area. Incidentally, in the embodiment, because water is used as liquid Lq as is previously described, hereinafter, the first liquid repellent area 28a and the second liquid repellent area 28b will also be referred to as a first water repellent plate 28a and a second water repellent plate 28b.

On an end on the +Y side of the first water repellent plate 28a, a measurement plate 30 is arranged. On measurement plate 30, a fiducial mark FM is arranged in the center, and a pair of aerial image measurement slit patterns (slit-shaped measurement patterns) SL is arranged with the mark in between And, in correspondence with each aerial image measurement slit pattern SL, a light-transmitting system (not shown) which guides illumination light IL passing through the slit patterns outside wafer stage WST (a photodetection system arranged in measurement stage MST which will be described later on) is arranged.

On second liquid repellent area 28b, scales for an encoder system (to be described later) are formed. More specifically, in areas on one side and the other side in the X-axis direction of the second water repellent plate 28b (both sides in the horizontal direction in FIG. 2A), Y scales $39Y_1$ and $39Y_2$ are formed, respectively, Y scales $39Y_1$ and $39Y_2$ are each composed of a reflective grating (for example, a diffraction grating) having a periodic direction in the Y-axis direction in which grid lines 38 having the longitudinal direction in the X-axis direction are formed in a predetermined pitch along a direction parallel to the Y-axis (the Y-axis direction). Similarly, in areas on one side and the other side in the Y-axis direction of the second water repellent plate 28b (both sides in the vertical direction in FIG. 2A), X scales $39X_1$ and $39X_2$ are formed, respectively, in a state where the scales are placed between Y scales $39Y_1$ and $39Y_2$. X scales $39X_1$ and $39X_2$ are each composed of a reflective grating (for example, a diffraction grating) having a periodic direction in the X-axis direction in which grid lines 37 having the longitudinal direction in the Y-axis direction are formed in a predetermined pitch along a direction parallel to the X-axis (the X-axis direction). The pitch of grid lines 37 and 38, for example, is set to 1 μm. Incidentally, in FIG. 2A, the pitch of the gratings is illustrated larger than the actual pitch for the sake of convenience. The same is true also in other drawings.

Incidentally, in order to protect the diffraction grating, it is also effective to cover the grating with a glass plate with low thermal expansion that has water repellency. In this case, as the glass plate, a plate whose thickness is the same level as the wafer, such as for example, a plate 1 mm thick, can be used, and the plate is set on the upper surface of wafer table WTB so that the surface of the glass plate becomes the same height (surface position) as the wafer surface.

Further, to the −Y end surface and the −X end surface of wafer table WTB, mirror-polishing is applied, respectively, and as shown in FIG. 2A, reflection surfaces 17a and 17b are formed for interferometer system 118 which will be described later in the description.

Measurement stage MST includes a stage main section 92 driven in the XY plane by a linear motor and the like (not shown), and a measurement table MTB mounted on stage main section 92, as shown in FIG. 1. Measurement stage MST is configured drivable in at least directions of three degrees of freedom (X, Y, and θz) with respect to base board 12 by a drive system (not shown).

Incidentally, in FIG. 7, the drive system of wafer stage WST and the drive system of measurement stage MST are included and are shown as stage drive system 124.

Figure 2B:
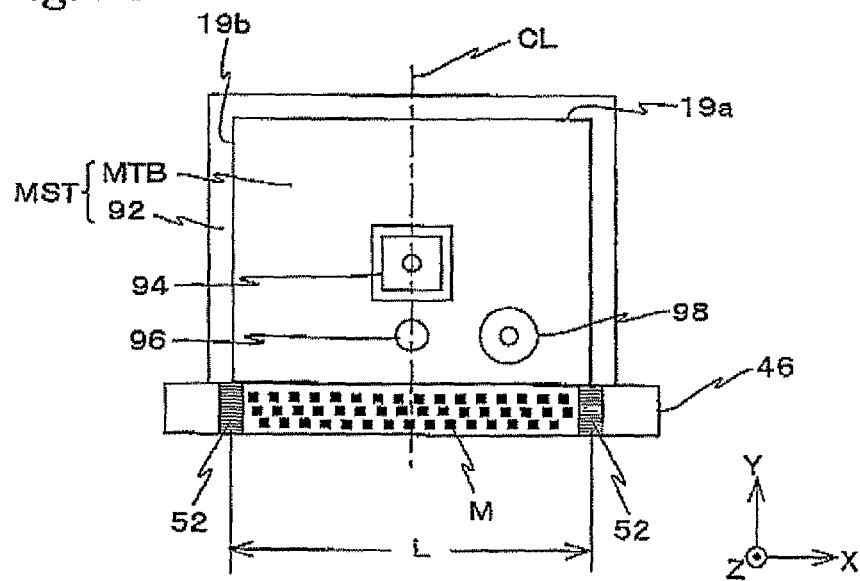
FIG. 2B is a planar view showing a measurement stage.

Various measurement members are arranged at measurement table MTB (and stage main section 92). As such measurement members, for example, as shown in FIG. 2B, members such as an uneven illuminance measuring sensor 94 that has a pinhole-shaped light-receiving section which receives illumination light IL on an image plane of projection optical system PL, an aerial image measuring instrument 96 that measures an aerial image (projected image) of a pattern projected by projection optical system PL, a wavefront aberration measuring instrument 98 by the Shack-Hartman method that is disclosed in, for example, the pamphlet of International Publication No. 2003/065428, an illuminance monitor (not shown) and the like are employed. Further, in stage main section 92, a pair of photodetection systems (not shown) is arranged in a placement facing the pair of light-transmitting systems (not shown) previously described. In the embodiment, in a state where wafer stage WST and measurement stage MST are in proximity within a predetermined distance in the Y-axis direction (including a contact state), illumination lights IL that has been transmitted through each aerial image measurement slit pattern SL of measurement plate 30 on wafer stage WST are guided by each light-transmitting system (not shown) and are received by light-receiving elements of each photodetection system (not shown) within measurement stage MST.

On the −Y side end surface of measurement table MTB, a fiducial bar (hereinafter, shortly referred to as an "FD bar"). 46 is arranged extending in the X-axis direction, as shown in FIG. 2B. In the vicinity of the end portions on one side and the other side in the longitudinal direction of FD bar 46, a reference grating (for example, a diffraction grating) 52 whose periodic direction is the Y-axis direction is respectively formed, placed symmetric to a center line CL. Further, on the upper surface of FD bar 46, a plurality of reference marks M is formed. As each of reference marks M, a two-dimensional mark having a size that can be detected by a primary alignment system and secondary alignment systems (to be described later) is used. Incidentally, the surface of FD bar 46 and the surface of measurement table MTB are also covered with a liquid repellent film (water repellent film).

On the +Y end surface and the −X end surface of measurement table MTB, reflection surfaces 19a and 19b are formed similar to wafer table WTB as is previously described (refer to FIG. 2B).

Figure 5:
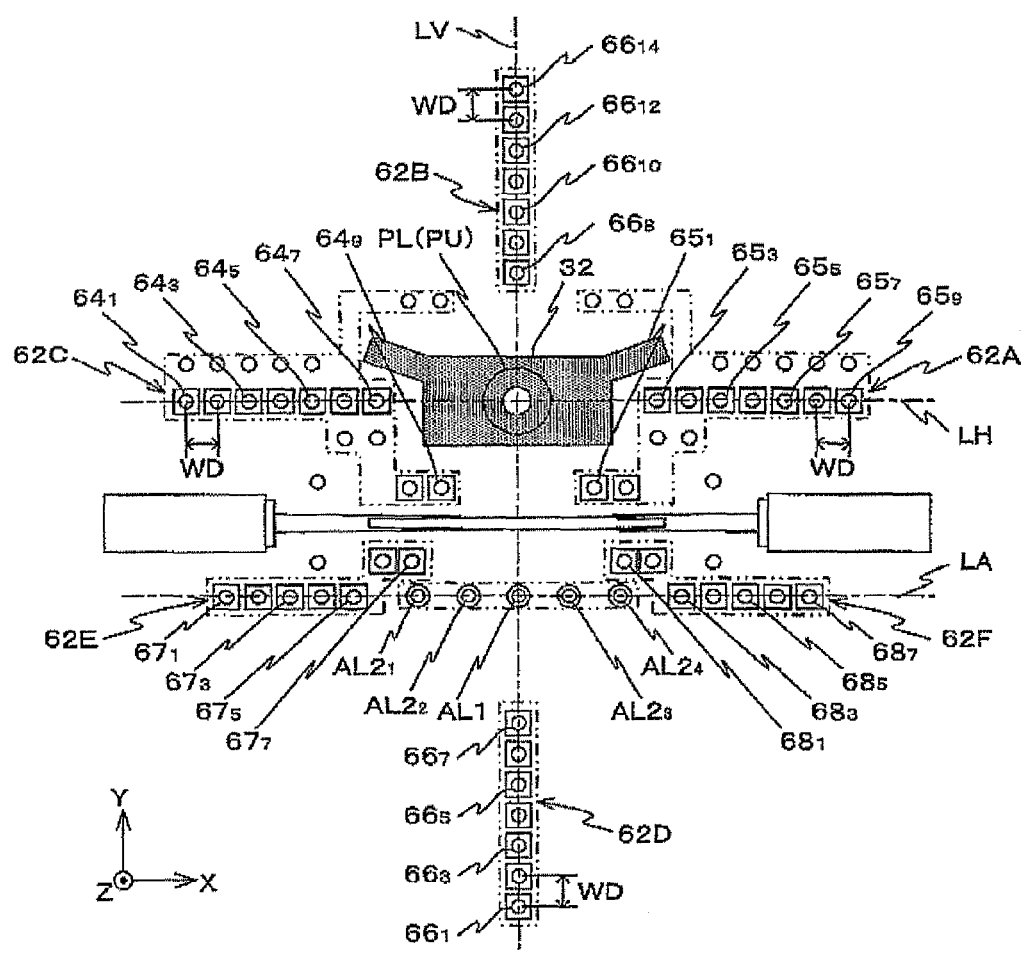
FIG. 5 is a view showing a placement of an encoder head (an X head and a Y head) and an alignment system.

In exposure apparatus 100 of the embodiment, a primary alignment system $AL_1$ having a detection center at a position spaced apart from optical axis AX of projection optical system PL at a predetermined distance on the −Y side is placed on reference axis LV previously described as shown in FIGS. 4 and 5. Primary alignment system AL1 is fixed by the lower surface of a (not shown) mainframe. On one side and the other side in the X-axis direction with primary alignment system AL1 in between, secondary alignment systems $AL2_1$ and $AL2_2$, and $AL2_3$ and $AL2_4$ whose detection centers are substantially symmetrically placed with respect to straight line LV are severally arranged. Secondary alignment systems $AL2_1$ to $AL2_4$ are fixed via a movable support member to the lower surface of the mainframe (not shown), and by drive mechanisms $60_1$ to $60_4$ (refer to FIG. 7), their detection areas (or detection center) can be driven independently in the X-axis direction. Accordingly, the relative positions of the detection areas of primary alignment system AL1 and secondary alignment systems $AL2_1$, $AL2_2$, $AL2_3$ and $AL2_4$ are adjustable in the X-axis direction. Incidentally, a straight line (a reference axis) LA which passes through the detection center of primary alignment system AL1 and is parallel to the X-axis shown in FIG. 4 and the like coincides with the optical axis of a measurement beam 86 from interferometer 127 previously described.

In the embodiment, as each of alignment systems AL1 and $AL2_1$ to $AL2_4$, for example, an FIA (Field Image Alignment) system by an image processing method is used. The imaging signals from each of alignment systems AL1 and $AL2_1$ to $AL2_4$ are supplied to main controller 20, via a signal processing system (not shown).

Incidentally, each of the alignment systems described above is not limited to the FIA system, and an alignment sensor, which irradiates a coherent detection light to a subject mark and detects a scattered light or a diffracted light generated from the subject mark or makes two diffracted lights (for example, diffracted lights of the same order or diffracted lights being diffracted in the same direction) generated from the subject mark interfere and detects an interference light, can naturally be used alone or in combination as needed.

Next, a configuration and the like of interferometer system 118 (refer to FIG. 7), which measures the positional information of wafer stage WST and measurement stage MST, will be described.

Figure 3:
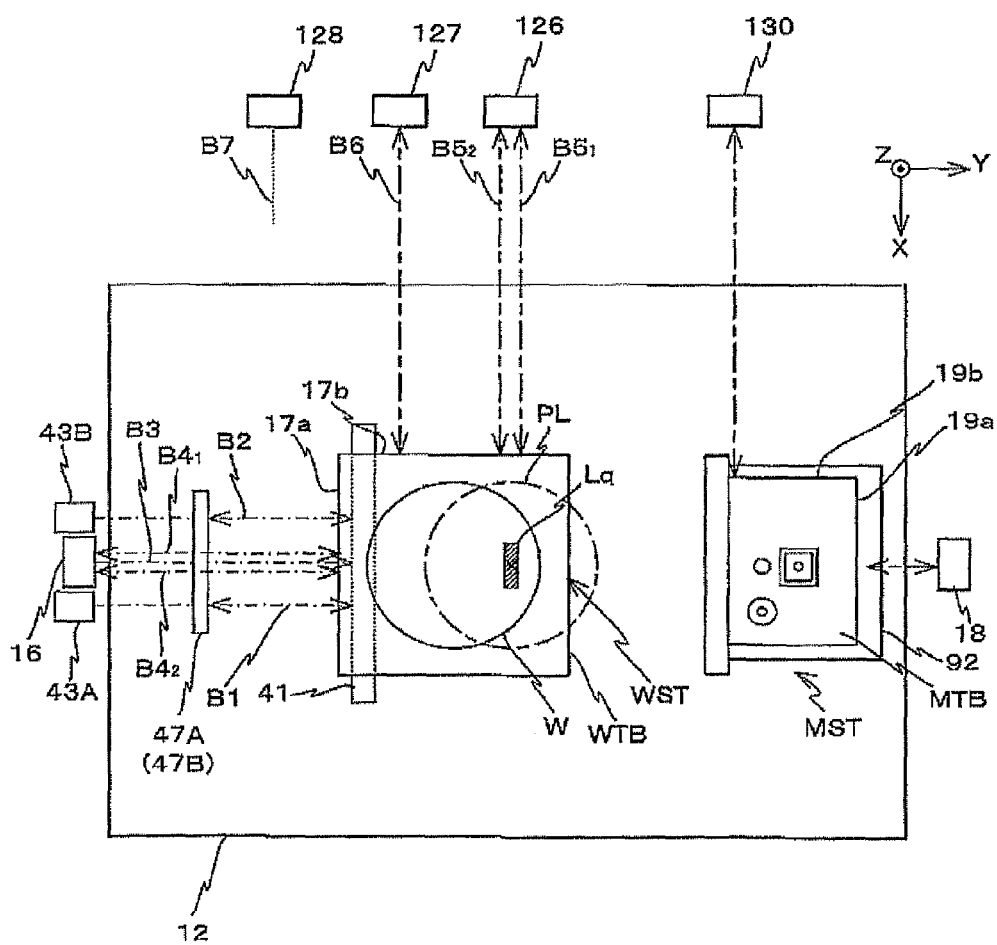
FIG. 3 is a view used to explain a placement of measurement axes of an interferometer system of the exposure apparatus in FIG. 1, and is a planar view of a stage device is, partially omitted.

Interferometer system 118 includes a Y interferometer 16, X interferometers 126, 127, and 128, and 2 interferometers 43A and 43B for position measurement of wafer stage WST, and a Y interferometer 18 and an X interferometer 130 for position measurement of measurement stage MST, as shown in FIG. 3. Y interferometer 16 and the three X interferometers 126, 127, and 128 each irradiate interferometer beams (measurement beams) B4 ($B4_1$, $B4_2$) B5 ($B5_1$, a $B5_2$), B6, and B7 on reflection surfaces 17a and 17b of wafer table WTB. And Y interferometer 16 and the three X interferometers 126, 127, and 128 each receive the reflected lights, and measure the positional information of wafer stage WST in the XY plane, and supply the positional information which has been measured to main controller 20.

Incidentally, for example, X interferometer 126 irradiates at least three measurement beams parallel to the X-axis including a pair of measurement beams $B5_1$ and $B5_2$ which passes through optical axis (in the embodiment, also coinciding with the center of exposure area IA previously described) AX of projection optical system PL and is symmetric about a straight line (reference axis LH (refer to FIGS. 4, 5 and the like)) parallel to the X-axis. Further, Y interferometer 16 irradiates at least three measurement beams parallel to the Y-axis including a pair of measurement beams $B4_1$ and $B4_2$ which is symmetric about reference axis LV previously described on reflection surface 17a and a movable mirror 41 (to be described later on). As described, in the embodiment, as each interferometer, a multiaxial interferometer which a plurality of measurement axis is used, with an exception for a part of the interferometers (for example, interferometer 128). Therefore, in addition to the X, Y positions of wafer table WTB (wafer stage WST), main controller 20 can also compute rotation information (that is, pitching amount) in the θx direction, rotation information (that is, rolling amount) in the θy direction, and rotation information (that is, yawing amount) in the θz direction, based on the measurement results of Y interferometer 16 and either X interferometers 126 or 127.

Further, as shown in FIG. 1, movable mirror 41 having a concave-shaped reflection surface is attached to the side surface on the −Y side of stage main section 91. As it can be seen from FIG. 2A, movable mirror 41 is designed so that the length in the X-axis direction is longer than reflection surface 17a of wafer table WTB.

A pair of Z interferometers 43A and 43B are arranged (refer to FIGS. 1 and 3), facing movable mirror 41. Z interferometers 43A and 43B irradiate two measurement beams B1 and B2, respectively, on fixed mirrors 47A and 47B, which are fixed, for example, on a frame (not shown) supporting projection unit PU, via movable mirror 41. And by receiving each reflected light, Z interferometers 43A and 43B measure the optical path length of measurement beams B1 and B2. And from the results, main controller 20 computes the position of wafer stage WST in four degrees of freedom (Y, z, θy, and θz) directions.

In the embodiment, position information within the XY plane (including the rotation information in the θz direction) of wafer stage WST (wafer table WTB) is mainly measured by an encoder system (to be described later). Interferometer system 118 is used when wafer stage WST is positioned outside the measurement area (for example, near unloading position UP and loading position LP as shown in FIG. 4) of the encoder system. Further, interferometer system 118 is used secondarily when correcting (calibrating) a long-term variation (for example, temporal deformation of the scale) of the measurement results of the encoder system and the like. As a matter of course, all positional information of wafer stage WST (wafer table WTB) can be measured using both interferometer system 118 and the encoder system together.

Y interferometer 18 and X interferometer 130 of interferometer system 118 irradiate interferometer beams (measurement beams) on reflection surfaces 19a and 19b of measurement table MTB as shown in FIG. 3, and measure the positional information of measurement stage MST (including, for example, at least the positional information in the X-axis and the Y-axis directions and the rotation information in the θz direction) by receiving the respective reflected lights, and supply the measurement results to main controller 20.

Next, the structure and the like of encoder system 150 (refer to FIG. 7) which measures the positional information of wafer stage WST in the XY plane (including rotation information in the θz direction) will be described.

In exposure apparatus 100 of the embodiment, as shown in FIG. 4, four head units 62A to 62D are placed in a state extending from nozzle unit 32 in four directions. These head units 62A to 62D are fixed to the mainframe (not shown) holding projection unit UP in a suspended state, via a support member.

Head units 62A and 62C are equipped with a plurality of (nine, in this case) Y heads $65_1$ to $65_9$ and $64_1$ to $64_9$, as shown in FIG. 5, respectively. In detail, head units 62A and 62C are equipped with a plurality of (seven, in this case) Y heads $65_3$ to $65_9$ and $64_3$ to $64_7$ placed at a distance WD on reference axis LH previously described, respectively, and a plurality of (two, in this case) Y heads $65_1$ and $65_2$, and $64_8$ and $64_9$ placed at distance WD a predetermined distance away from reference axis LH in the −Y direction on the −Y side of nozzle unit 32 in parallel with reference axis LH, respectively. Incidentally, the distance between Y heads $65_2$ and $65_3$ and Y heads $64_7$ and $64_8$ in the X-axis direction is also set to WD. Hereinafter, Y heads $65_1$ to $65_9$ and $64_1$ to $64_9$ will also be described as Y heads 65 and 64, respectively, as necessary.

Head unit 62A constitutes a multiple-lens (nine-lens, in this case) Y linear encoder (hereinafter, shortly referred to as a "Y encoder" or an "encoder" as appropriate) 70A (refer to FIG. 7) that measures the position of wafer stage WST (water table WTB) in the Y-axis direction (Y position), using Y scale $39Y_1$ previously described. Similarly, head unit 62C constitutes a multiple-lens (nine-lens, in this case) Y linear encoder 70C (refer to FIG. 7) that measures the Y position of wafer stage WST (wafer table WTB) using Y scale $39Y_2$ described above. In this case, distance WD in the X-axis direction of the nine Y heads 64 and 65 (to be more accurate, the irradiation points of the measurement beams generated by Y heads 65 and 64 on the scale) that head units 62A and 62C are each equipped with, is set slightly narrower than the width (to be more precise, the length of grid line 38) of Y scales $39Y_1$ and $39Y_2$ in the X-axis direction. Accordingly, of each nine Y heads 65 and 64, at least two heads each constantly face the corresponding Y scales $39Y_1$ and $39Y_2$ at the time of the exposure. More specifically, of the measurement beams which each nine Y heads 65 and 64 generate, at least two measurement beams each can be irradiated on the corresponding Y scales $39Y_1$ and $39Y_2$.

As shown in FIG. 5, head unit 62B is placed on the +Y side of nozzle unit 32 (projection unit PU), and is equipped with a plurality of, in this case, seven X heads $66_8$ to $66_{14}$ that are placed on reference axis LV previously described along Y-axis direction at distance WD. Further, head unit 62D is placed on the −Y side of primary alignment system AL1, on the opposite side of head unit 62B via nozzle unit 32 (projection unit PU), and is equipped with a plurality of, in this case, seven X heads $66_1$ to $66_7$ that are placed on reference axis LV at distance WD. Hereinafter, X heads $66_1$ to $66_{14}$ will also be described as X heads 66, as necessary.

Head unit 62B constitutes a multiple-lens (seven-lens, in this case) X linear encoder (hereinafter, shortly referred to as an "X encoder" or an "encoder" as needed) 70B (refer to FIG. 7) that measures the position in the X-axis direction (the X-position) of wafer stage WST (wafer table WTB) using X scale $39X_1$ previously described. Further, head unit 62D constitutes a multiple-lens (seven-lens, in this case) X linear encoder 70D (refer to FIG. 7) that measures the X-position of wafer stage WST (wafer table WTB) using X scale $39X_2$ previously described.

Here, distance WD between adjacent X heads 66 (to be more accurate, the irradiation point of the measurement beam generated by X head 66 on the scale) in the Y-axis direction that are equipped in each of head units 62B and 62D is set shorter than half the width of X scales $39X_1$ and $39X_2$ (to be more accurate, the length of grid line 37) in the Y-axis direction. Accordingly, of the X heads 66 which head units 62B and 62D are equipped with, at least two heads face the corresponding X scales $39X_1$ and $39X_2$ at the time of the exposure and the like, except for times such as switching (linkage)

which will be described later. More specifically, of the measurement beams which each seven X heads 66 generate, at least two measurement beams each can be irradiated on the corresponding X scales $39X_1$ and $39X_2$. Incidentally, the distance between X head $66_8$ farthest to the −Y side of head unit 62B and x head $66_7$ farthest to the +Y side of head unit 62D is set slightly narrower than the width of wafer table WTB in the Y-axis direction so that switching (linkage described below) becomes possible between the two X heads by the movement of wafer stage WST in the Y-axis direction.

Incidentally, in the placement of X head 66 in the embodiment, on the switching (linkage) described above, only x head $66_8$ farthest to the −Y side among X heads 66 belonging to head unit 62B faces the corresponding X scale $39X_1$, and only X head $66_7$ farthest to the +Y side among X heads 66 belonging to head unit 62D faces the corresponding X scale $39X_2$. More specifically, only one each of the X heads 66 faces X scales $39X_1$ and $39X_2$. Therefore, the distance between head unit 62B and 62D can be narrower than distance WD, and at least one of X heads $66_6$ and $66_9$ can be made to face the corresponding X scales at the same time, as well as X head $66_8$ and X head $66_7$ which face the corresponding X scales also at the time of switching (linkage).

In the embodiment, furthermore, as shown in FIG. 4, head units 62E and 62F are respectively arranged a predetermined distance away on the −Y side of head units 62C and 62A. These head units 62E and 62F are fixed to the mainframe (not shown) holding projection unit UP in a suspended state, via a support member.

Head unit 62E is equipped with seven Y heads $67_1$ to $67_7$, as shown in FIG. 5. More particularly, head unit 62E is equipped with five Y heads $67_1$ to $67_5$ placed on the −X side of the secondary alignment system $AL2_1$ on reference axis LA at substantially the same distance as distance WD previously described, and two Y heads $67_6$ and $67_7$ placed on the +Y side of the secondary alignment system $AL2_1$ a predetermined distance away in the +Y direction from reference axis LA, at distance WD parallel to reference axis LA. Incidentally, the distance between Y heads $67_5$ and $67_6$ in the X-axis direction is also set to WD. Hereinafter, Y heads $67_1$ to $67_7$ will also be described, appropriately, as Y head 67.

Head unit 62F is symmetrical to head unit 62E with respect to reference axis LV previously described, and is equipped with seven Y heads $68_1$ to $68_7$ which are placed in symmetry to the seven Y heads 67 with respect to reference axis LV. Hereinafter, Y heads $68_1$ to $68_7$ will also be described, appropriately, as Y head 68.

On alignment operation and the like, at least two each of Y heads 67 and 68 face Y scales $39Y_2$ and $39Y_1$, respectively. More specifically, of the measurement beams which each seven Y heads 67 and 68 generate, at least two measurement beams each can be constantly irradiated on Y scales $39Y_1$ and $39X_2$ at the time of alignment and the like. The Y position (and θz rotation) of wafer stage WST is measured by these Y heads 67 and 68 (more specifically, Y encoders 70E and 70F configured by Y heads 67 and 68).

Further, in the embodiment, at the time of baseline measurement and the like of the secondary alignment system, Y head $67_5$ and $68_3$ which are adjacent to the secondary alignment systems $AL2_1$ and $AL2_4$ in the X-axis direction face the pair of reference gratings 52 of FD bar 46, respectively, and by Y heads $67_5$ and $68_3$ that face the pair of reference gratings 52, the Y position of FD bar 46 is measured at the position of each reference grating 52. In the description below, the encoders configured by Y heads $67_5$ and $68_3$ which face a pair of reference gratings 52, respectively, are referred to as Y linear encoders (also shortly referred to as a "Y encoder" or an "encoder" as needed) $70E_2$ and $70F_2$. Further, for identification, Y encoders 70E and 70F configured by Y heads 67 and 65 that face Y scales $39Y_2$ and $39Y_1$ described above, respectively, will be referred to as Y encoders $70E_1$ and $70F_1$.

The measurement values of linear encoders 70A to 70F described above is supplied to main controller 20, and main controller 20 controls the position within the XY plane of wafer stage WST based on three measurement values of linear encoders 70A to 70D or on three measurement values of encoders 70B, 70D, $70E_1$, and $70F_1$, and also controls the rotation in the θz direction of FD bar 46 based on the measurement values of linear encoders $70E_2$ and $70F_2$.

Figure 6:
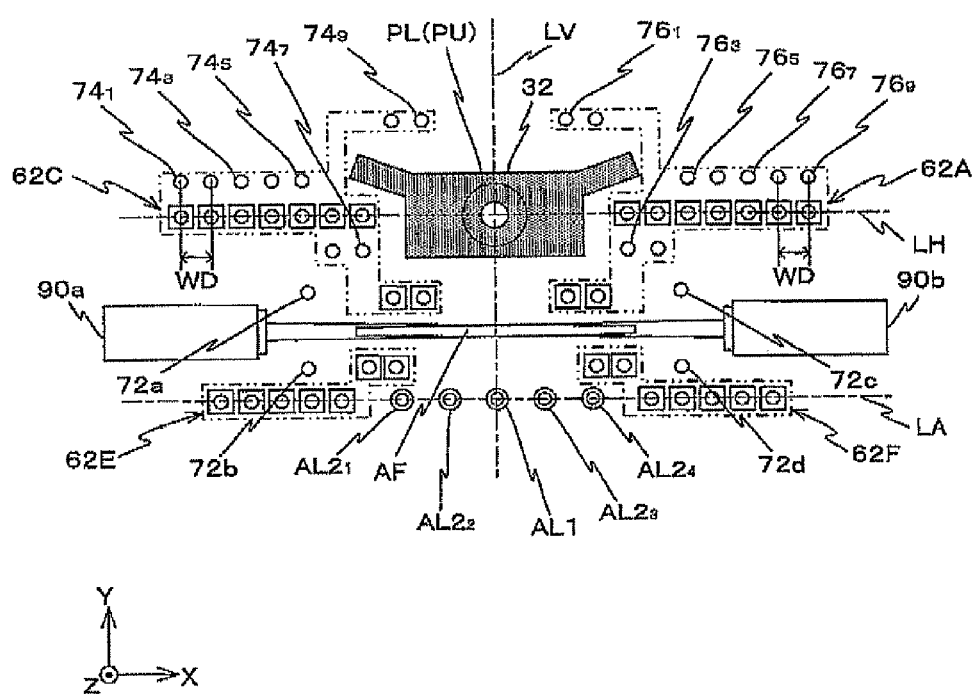
FIG. 6 is a view showing a placement of a Z head and a multipoint AF system.

In exposure apparatus 100 of the embodiment, as shown in FIGS. 4 and 6, a multipoint focal position detecting system (hereinafter, shortly referred to as a "multipoint AF system") by an oblique incident method is arranged, which is composed of an irradiation system 90a and a photodetection system 90b, having a configuration similar to the one disclosed in, for example, U.S. Pat. No. 5,448,332 and the like. In the embodiment, as an example, irradiation system 90a is placed on the +Y side of the −X end portion of head unit 62E previously described, and photodetection system 90b is placed on the +Y side of the +X end portion of head unit 62F previously described in a state of opposing irradiation system 90a. The multipoint AF system (90a, 90b) is fixed to the lower surface of the mainframe (not shown) holding projection unit PU previously described.

A plurality of detection points of the multipoint AF system (90a, 90b) are placed at a predetermined distance along the X-axis direction on the surface to be detected. In the embodiment, the plurality of detection points are placed, for example, in the arrangement of a matrix having one row and M columns (M is a total number of detection points) or having two rows and N columns (N=M/2). In FIGS. 4 and 6, the plurality of detection points to which a detection beam is severally irradiated are not individually shown, but are shown as an elongate detection area (beam area) AF that extends in the X-axis direction between irradiation system 90a and photodetection system 90b. Because the length of detection area AF in the X-axis direction is set to around the same as the diameter of wafer W, by only scanning wafer W in the Y-axis direction once, position information (surface position information) in the Z-axis direction across the entire surface of wafer W can be measured.

As shown in FIG. 6, in the vicinity of both end portions of beam area AF of the multipoint AF system (90a, 90b) r heads 72a and 72b, and 72c and 72d of surface position sensors for Z position measurement (hereinafter, shortly referred to as "Z heads") are arranged each in a pair, in symmetrical placement with respect to reference axis LV. Z heads 72a to 72d are fixed to the lower surface of a main frame (not shown).

As Z heads 72a to 72d, for example, a head of an optical displacement sensor similar to an optical pickup used in a CD drive device is used. Z heads 72a to 72d irradiate measurement beams to wafer table WTB from above and by receiving the reflected lights, measure the positional information (surface position information) of the surface of wafer table WTB in the Z-axis direction orthogonal to the XY plane at the irradiation point. Incidentally, in the embodiment, a configuration is employed where the measurement beams of the Z heads are reflected by the reflection grating configuring the Y scales $39Y_1$ and $39Y_2$ previously described.

Furthermore, as shown in FIG. 6, head units 62A and 62C previously described are respectively equipped with z heads $76_j$ and $74_i$ (i, j=1−9), which are nine heads each, at the same X position as Y heads $65_j$ and $64_i$ (i, j=1−9) that head units 62A and 62C are respectively equipped with, with the Y position shifted. In this case, Z heads $76_5$ to $76_9$ and $74_1$ to $74_5$, which are five heads each on the outer side belonging to head units 62A and 62C, respectively, are placed parallel to reference axis LH a predetermined distance away in the +Y direction from reference axis LH. Further, Z heads $76_1$ and $76_2$ and Z heads $74_8$ and $74_9$, which are two heads on the innermost side belonging to head units 62A and 62C, respectively, are placed on the +Y side of projection unit PU, and the remaining z heads $76_3$ and $76_4$, and $74_6$ and $74_7$ are placed on the −Y side of Y heads $65a$ and $65_4$, and $64_6$ and $64_7$, respectively. And Z heads $76_j$ and $74_i$, which are nine heads each belonging to head units 62A and 62C, respectively, are placed symmetric to each other with respect to reference axis LV. Incidentally, as each of the Z heads $76_j$ and $74_i$, an optical displacement sensor head similar to Z heads $72a$ to $72d$ described above is used.

The distance of the nine Z heads $76_j$ and $74_i$ (to be more accurate, the irradiation point of the measurement beam generated by the Z heads on the scale) in the X-axis direction that are equipped in each of head units 62A and 62C is set equal to distance WD of Y heads 65 and 64 in the X-axis direction. Accordingly, similar to Y heads 65 and 64, of each nine Z heads $76_j$ and $74_i$, at least two heads each constantly face the corresponding Y scales $39Y_1$ and $39Y_2$ at the time of the exposure and the like. More specifically, of the measurement beams which each nine Z heads $76_j$ and $74_i$ generate, at least two measurement beams each can be irradiated on the corresponding Y scales $39Y_1$ and $39Y_2$.

Z heads $72a$ to $72d$, $74_1$ to $74_9$, and $76_1$ to $76_9$ connect to main controller 20 via a signal processing/selection device 170 as shown in FIG. 7, and main controller 20 selects an arbitrary Z head from Z heads $72a$ to $72d$, $74_1$ to $74_9$, and $76_1$ to $76_9$ via signal processing/selection device 170 and makes the head move into an operating state, and then receives the surface position information detected by the Z head which is in an operating state via signal processing/selection device 170. In the embodiment, a surface position measurement system 180 (a part of measurement system 200) that measures positional information of wafer stage WST in the Z-axis direction and the direction of inclination with respect to the XY plane is configured, including Z heads $72a$ to $72d$, $74_1$ to $74_9$, and $76_1$ to $76_9$, and signal processing (selection device 170.

Furthermore, in exposure apparatus 100, above reticle stage RST, a pair of reticle alignment detection systems 13A and 13B (not shown in FIG. 1, refer to FIG. 7) consisting of TTR (Through The Reticle) alignment systems which use lights of the exposure wavelength is arranged. Detection signals of reticle alignment detection systems 13A and 13B are supplied to main controller 20 via an alignment signal processing system (not shown).

FIG. 7 shows the main configuration of the control system of exposure apparatus 100. The control system is mainly configured of main controller 20 composed of a microcomputer (or workstation) that performs overall control of the entire apparatus. Incidentally, in FIG. 7, various sensors such as uneven illuminance measuring sensor 94, aerial image measuring instrument 96 and wavefront aberration measuring instrument 98 that are arranged at measurement stage MST are collectively shown as a sensor group 99.

Figure 9A:
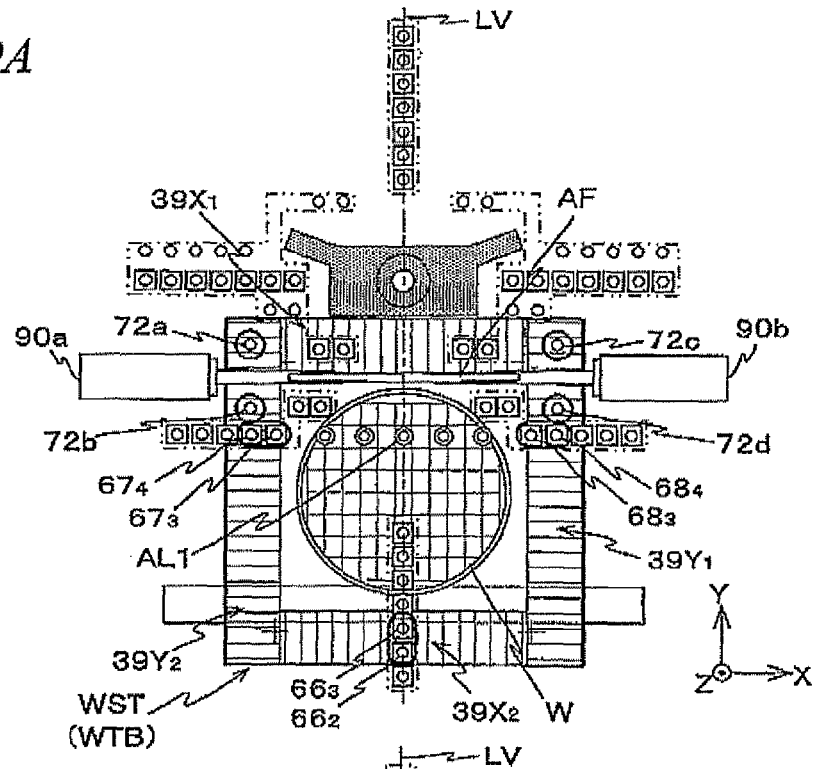
FIGS. 9A to 9C are views used to explain focus mapping.
Figure 9B:
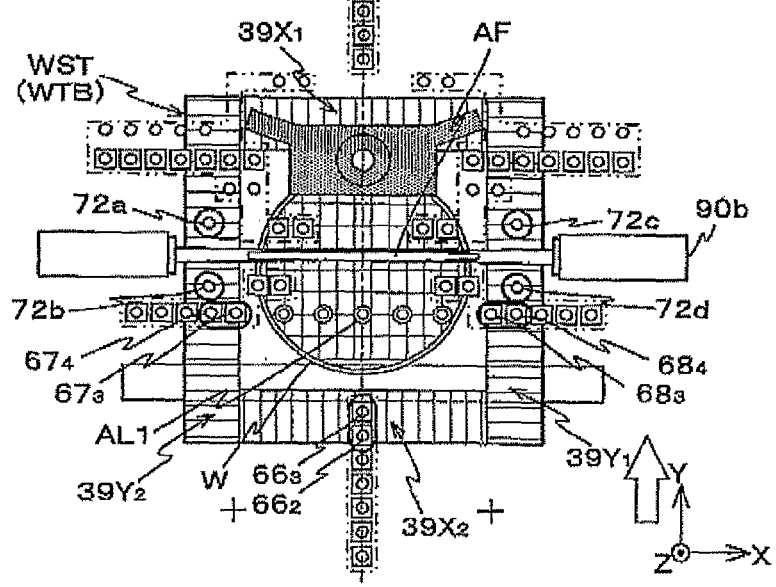

In exposure apparatus 100 of the embodiment, because the placement of the X scales and the Y scales on wafer table WTB previously described and the placement of the X heads and the Y heads previously described were employed, as shown in FIGS. 9A and 9B, in the effective stroke range (a range where the stage moves for alignment and exposure operation in the embodiment) of wafer stage WST, Y scales $39Y_1$ and $39Y_2$ face Y heads 65 and 64 (head units 62A and 62C) or Y heads 68 and 67 (head units 62F and 62E), while X head 66 (head unit 62B or 62D) also faces one of X scales $39X_1$ and $39X_2$ without fail. Incidentally, in FIGS. 9A and 9B, the heads which face the corresponding X scales and Y scales are shown circled by a solid line.

As previously described, each of the head units 62A and 62C constantly makes at least two Z heads face the corresponding Y scale (to be more precise, at least two measurement beans can be constantly irradiated on the corresponding scale). Therefore, main controller 20 pairs at least two heads facing the scale and uses the pairs for each of the head units 62A to 62F. Then, main controller 20 constantly monitors the measurement values of the two heads, and uses one of the measurement values as a representative of the pair of heads (or the head unit to which the two heads belong). Of the two heads, main controller 20, for example, uses the head which faces the scale first as a priority head, and the head which faces the scale later on as an auxiliary head. Or, main controller 20 can use the head near the center of the scale in a direction orthogonal to the longitudinal direction as a priority head, and the remaining head can be used as an auxiliary head. Main controller 20 can normally use the measurement values of the priority head as a representative, and in the case abnormality occurs in the output (measurement value) of the priority head, the measurement values of the auxiliary head can be used as the measurement values of the pair of heads (or head unit). Main controller 20 monitors the measurement values of the six head units according to this handling.

Main controller 20, for example, predicts the measurement values of the individual encoders using the measurement results of interferometer system 118 to inspect the correctness of the measurement result of the priority head, especially to inspect the output abnormality of the priority head due to abnormality (the scale in the embodiment) on the reflection surface on which the measurement beam is irradiated, and when the absolute value of the difference between the predicted value and the actual value is equal to or below a predetermined threshold value, main controller 20 judges that the measurement results are normal, whereas when the difference exceeds the threshold value, main controller 20 judges that abnormality has occurred.

Therefore, in the range where wafer stage WST moves for exposure operation, by controlling each motor that configures stage drive system 124 based on the measurement values of the two head units 62A and 62C (the Z heads belonging to each unit), the surface position of wafer table WTB (position of wafer stage WST in the Z-axis direction) and the position of tilt direction (position in the θy direction) can be controlled in a stable manner and with high precision.

Figure 8:
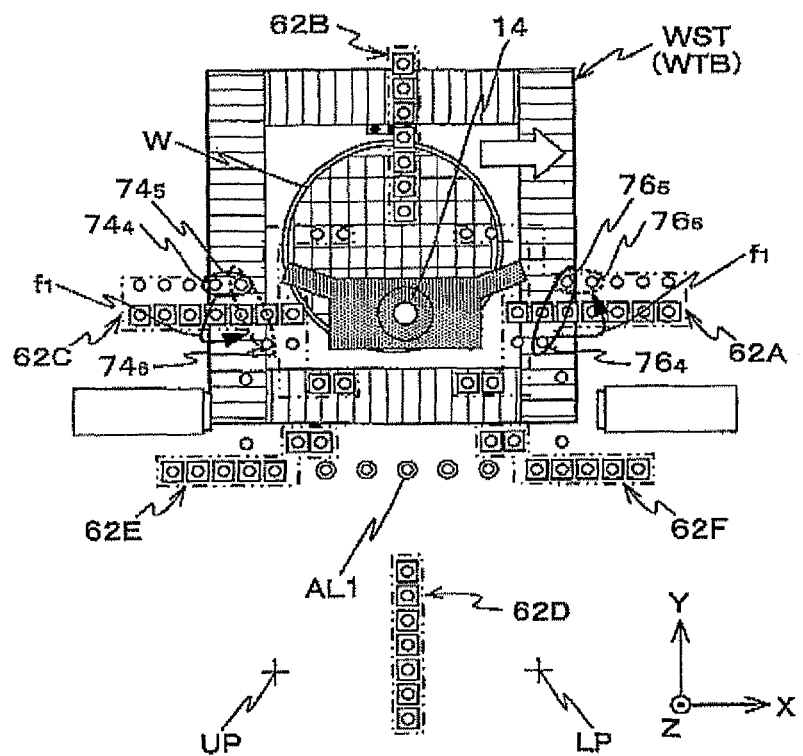
FIG. 8 is a view used to describe position measurement of a wafer table in a Z-axis direction and a tilt direction by a plurality of Z heads, and a switching of the Z heads.

Further, when main controller 20 drives wafer stage WST in the X-axis direction as shown by an outlined arrow in FIG. 8, the pair of Z heads 76 and 74, which measures the surface position of wafer stage WST, is sequentially switched to an adjacent pair of heads as shown by an arrow ti in FIG. 8. To enter the details, as for Z head 76, the pair of heads is switched from the pair $76_4$ and $76_5$ surrounded by the circle in a solid line to the pair $76_5$ and $76_6$ surrounded by the circle in a dotted liner and as for Z head 74, the pair of heads is switched from the pair $74_4$ and $74_5$ surrounded by the circle in a solid line to the pair $74_5$ and $74_6$ surrounded by the circle in a dotted line. In this case, one head ($76_5$, $74_5$) is common in the pair of heads before the switching and the pair of heads after the switching.

In the embodiment, in order to perform the switching (linkage) of the Z heads 76 and 74 smoothly, as is previously described, of the Z heads 76 and 74 that head units 62A and 62C are equipped with, the distance (twice the distance WD of adjacent heads in the X-axis direction) between the two heads to be switched (for example, in the example in FIG. 8, Z heads $76_4$ and $76_6$, and $74_4$ and $74_6$) is set smaller than the width of Y scales $39Y_1$ and $39Y_2$ in the X-axis direction. In other words, distance WD of adjacent Z heads is set it is narrower than half the width of Y scales $39Y_1$ and $39Y_2$ in the X-axis direction.

In the embodiment, a method is employed where the head used for measuring the Z position of wafer stage WST is switched from a pair of heads (for example, Zh1 and Zh2) to another pair of heads (Zh2 and Zh3) including one of the heads (Zh2), with the movement of wafer stage WST. However, as well as this method, a modified method of switching to another pair of heads (Zh3 and Zh4) which does not include a common head from a certain pair of heads (for example, Zh1 and Zh2) can be adopted. Also in this modified method, similar to the method described above, the measurement values of the priority head should be used normally, and at the time of abnormality, the measurement values of the auxiliary head should be used representatively as the measurement values of the pair of heads (or the head unit to which these heads belong).

Incidentally, as the cause of abnormality being generated in the measurement values of the Z heads, there is two major causes, that is, a cause coming from malfunction of the encoder head (head), and a cause coming from abnormality of the reflection surface (in the embodiment, the Y scale) on which the measurement beam is irradiated, As an example of the former case, a mechanical failure of the head can be representatively given. To be concrete, a failure in the head itself, a failure in the measurement beam light source, a situation where water droplets adhere on the head and the like can be given. A situation where the intensity of the measurement beam becomes extremely low, if not the measurement beam light source fails to operate, can be said to be a cause coming from the head. Meanwhile, as an example of the latter case, the case can be given in which the liquid of the liquid immersion area remains or foreign materials such as dust and the like adheres on the surface of the reflection surface (Y scale), and the measurement beam scans the remaining liquid or the adhered foreign material.

The method in the embodiment in which a pair of heads configured by a priority head and an auxiliary head is made to constantly face at least one corresponding reflection surface is effective to abnormality of the measurement values due to abnormality on the reflection surface, and is also effective to abnormality of the measurement values due to malfunction of the heads.

Next, detection of position information (surface position information) of the wafer W surface in the Z-axis direction (hereinafter, referred to as focus mapping) that is performed in exposure apparatus 100 of the embodiment will be described.

On this focus mapping, as is shown in FIG. 9A, main controller 20 controls the position within the XY plane of wafer table WTB based on one (X linear encoder MOD) of the two X heads 66 (surrounded by an elongated circle) facing X scale $39X_2$, and a predetermined one (Y linear encoders 70A and 70C) of the Y heads 68 and 67 (surrounded by elongated circles), which are two heads each, facing Y scales $39Y_1$ and $Y_2$, respectively. In the state of FIG. 9A, a straight line (centerline) parallel to the Y-axis that passes through the center of wafer table WTB (which substantially coincides with the center of wafer W) coincides with reference axis LV previously described.

Then, in this state, main controller 20 starts scanning of wafer stage WST in the +Y direction, and after having started the scanning, activates (turns ON) both Z heads 72a to 72d and the multipoint AF system (90a, 90b) by the time when wafer stage WST moves in the +Y direction and detection beams of the multipoint AF system (90a, 90b) begin to be irradiated on wafer W.

Then, in a state where Z heads 72a to 72d and the multipoint AF system (90a, 90b) simultaneously operate, as is shown in FIG. 9B, position information (surface position information) of the wafer table WTB surface (surface of plate 28) in the Z-axis direction that is measured by Z heads 72a to 72d and position information (surface position information) of the wafer W surface in the Z-axis direction at a plurality of detection points that is detected by the multipoint AF system (90a, 90b) are loaded at a predetermined sampling interval while wafer stage WST is proceeding in the +Y direction, and three kinds of information, which are each surface position information that has been loaded and the measurement values of Y linear encoders 70A and 70C at the time of each sampling, are made to correspond to one another and are sequentially stored in a memory (not shown).

Then, when the detection beams of the multipoint AF system (90a, 90b) begin to miss wafer W, main controller 20 ends the sampling described above and converts the surface position information at each detection point of the multipoint AF system (90a, 90b) into data which uses the surface position information by Z heads 72a to 72d that has been loaded simultaneously as a reference.

Figure 9C:
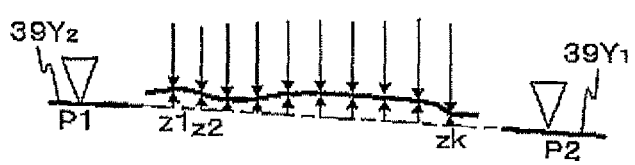

More specifically, based on an average value of the measurement values of Z heads 72a and 72b, main controller 20 obtains the surface position information of a predetermined point (for example, a point corresponding to a midpoint of the respective measurement points of Z heads 72a and 72b, that is, a point on substantially the same X-axis as the array of a plurality of detection points of the multipoint AF system (90a, 90b): hereinafter, this point is referred to as a left measurement point P1) on an area (an area where Y scale $39Y_2$ is formed) near the edge section on the −X side of plate 28. Further, based on an average value of the measurement values of Z heads 72c and 72d, main controller 20 obtains the surface position information at a predetermined point (for example, a point corresponding to a midpoint of the respective measurement points of Z heads 72c and 72d, that is, a point on substantially the same X-axis as the array of a plurality of detection points of the multipoint AF system (90a, 90b): hereinafter, this point is referred to as a right measurement point P2) on an area (an area where Y scale $39Y_1$ is formed) near the edge section on the +X side of plate 28. Then, as shown in FIG. 9C, main controller 20 converts the surface position information at each detection point of the multipoint AF system (90a, 90b) into surface position data z1-zk, which uses a straight line that connects the surface position of left measurement point P1 and the surface position of right measurement point P2 as a reference. Main controller 20 performs such a conversion on all information taken in during the sampling.

By obtaining such converted data in advance in the manner described above, for example, in the case of exposure, main controller 20 measures the wafer table WTB surface (a point on the area where Y scale $39Y_2$ is formed (a point near left measurement point P1 described above) and a point on the area where Y scale $39Y_1$ is formed (a point near right measurement point P1 described above)) with Z heads 74 and 76 previously described, and computes the Z position and θy rotation (rolling) amount θy of wafer table WTB. Then, by performing a predetermined operation using the Z position, the rolling amount θy, and the θx rotation (pitching) amount θx of wafer table WTB measured with Y interferometer 16, main controller 20 computes the Z position ($Z_0$) of the wafer table WTB surface in the center (exposure center) of exposure area IA previously described, or in other words, the Z position ($Z_0$) of wafer stage WST, rolling amount θy, and pitching amount ex, and based on the computation results, obtains a straight line passing through the exposure center that connects the surface position of left measurement point P1 and the surface position of right measurement point P2 described above, and by using this straight line and surface position data zl to zk, performs surface position control (focus leveling control) of the upper surface of wafer W, without actually acquiring the surface position information of the wafer W surface. Accordingly, because there is no problem even if the multipoint AF system is placed at a position away from projection optical system PL, the focus mapping of the embodiment can suitably be applied also to an exposure apparatus and the like that has a short working distance.

In exposure apparatus 100 of the embodiment, a parallel processing operation using wafer stage WST and measurement stage MST is performed, basically in the same procedure as the exposure apparatus disclosed in the embodiment of the pamphlet of International Publication 2007/097379 previously described. Because this parallel processing operation is similar to the exposure apparatus disclosed in the embodiment of the pamphlet of International Publication 2007/097379 previously described except for the following two points, a detailed description will be omitted.

The first point is, when abnormality occurs in the output of one of the priority heads (the X head or the Y head) used for position measurement of the encoder system which measures the positional information of wafer stage WST in the case wafer stage WST is in the effective stroke area previously described, main controller 20 uses the measurement values of the auxiliary head which configures a pair of heads with the priority head as is previously described as the measurement values of the pair of heads (or the head unit to which the two heads belong).

The second point is, for example, at the time of stepping operation between shots of wafer stage WST on the exposure operation by the step-and-scan method, a switching of heads is performed by a switching method in which the encoder head used for measuring, for example, the X position of wafer stage WST is switched from a pair of heads (for example, Eh1 and Eh2) to another pair of heads (Eh2 and Eh3) which include one of the heads (Eh2).

As discussed in detail above, according to exposure apparatus 100 related to the embodiment, when wafer stage WST is located in the range where wafer stage WST moves for exposure operation by the step-and-scan method, two Z heads each or more of the plurality of Z heads belonging to head units 62C and 62A constantly face Y scales $39Y_1$ and $39Y_2$, respectively, arranged on wafer stage WST. Therefore, main controller 20 can constantly measure the positional information of wafer stage WST (wafer table WTB) in the Z-axis direction and rotation information (rolling amount) in the θy direction with high precision (without being affected by air fluctuation and the like), using the measurement results of at least one head (the priority head when the two Z heads are in correspondence with the corresponding Y scales, or the auxiliary head when abnormality occurs in the output of the priority head) of the two Z heads each or more. Further, main controller 20 can measure the θx rotation of wafer table WTB with good accuracy, based on the measurement values of Y interferometer 16.

Further, in the case abnormality due to the abnormality of the scale (reflection surface) occurs in the measurement information of the priority head of at least the two heads located in the effective area (a grating section) on each scale, main controller 20 switches the measurement information used in position control of wafer stage WST in the Z-axis direction (and the θy direction) from the measurement information obtained by the priority head to the measurement information from the auxiliary head. By this switching, it becomes possible to securely measure the positional information of wafer stage WST in the Z-axis direction (and the θy direction).

Further, according to exposure apparatus 100 related to the embodiment, by performing the focus leveling control of the water with high accuracy during scanning exposure using the Z heads without measuring the surface position information of the wafer surface during exposure, based on the results of focus mapping performed beforehand, it becomes possible to form a pattern on wafer W with good precision. Furthermore, in the embodiment, because a high-resolution exposure can be realized by liquid immersion exposure, a fine pattern can be transferred with good precision on wafer W also from this viewpoint.

Further, as is obvious from FIG. 6, of the plurality of Z heads 74 and 76 respectively belonging to head units 62C and 62A used to control the Z position and θy rotation of wafer table WTB at the time of exposure, the position in the Y-axis direction of a part of the Z heads $74_6$ to $74_9$ and $76_1$ to $76_4$ is made to be different from other Z heads in the same unit. Accordingly, the plurality of Z heads 74 and 76 belonging to head units 62C and 62A can be placed at the empty spaces in the periphery of projection unit PU, while avoiding nozzle unit 32, liquid supply piping 31A, and liquid recovery piping 31B which configure a part of liquid immersion device 8. The same can be said for the Y heads belonging to head units 62C and 62A. In this case, head unit 62C which includes Z head 74 and Y head 64 and head unit 62A which includes Z head 76 and Y head 65 can be placed at the empty spaces in the periphery of projection unit PU without any problems, while the distance between adjacent Z heads (and Y heads 64 and 65) in the X-axis direction is set to a desired distance, as in, for example, distance WD, such as, for example, 35 mm, which is narrower than half the width of Y scales $39Y_1$ and $39Y_2$ in the X-axis direction (for example, 76 mm). Accordingly, the switching between adjacent Z heads can be performed without any problems when wafer table WTB moves, and this also makes it possible to reduce the size of the entire apparatus.

In the embodiment above, while the case has been described where the Z heads belonging to head units 62A and 62C are used as a pair of heads with two heads forming a set, along with this, Z heads 72a, 72b, 72c, and 12d used at the time of focus mapping can each be configured by a set of two Z heads (a pair of heads), and in the pair of heads, one of the heads can be a priority head, and when abnormality occurs in the output of the priority head, the Z head used for Z position control of wafer stage WST can be switched to an auxiliary head.

Modified Example

Incidentally, in the embodiment above, two Z heads were constantly facing a common scale so that the positional information of water stage WST in the Z-axis direction can be measured in a stable manner and with high precision. And, of a pair of heads consisting of the two heads, measurement values of a priority head was used, and in the case abnormality was generated in the measurement value of the priority head due to abnormality of the Y scale (reflection surface), measurement values of the other auxiliary head were to be used. However, as well as this, as a measurement: method constantly using the two heads, which are the priority head and the auxiliary head, various modified examples can be considered.

Some representative examples will be shown below, which are modified examples, referring to FIGS. 10A to 12B. Incidentally, in FIG. 10A to FIG. 12, scale SY (more specifically, the wager stage) is to be moved in the −X direction.

Figure 10A:
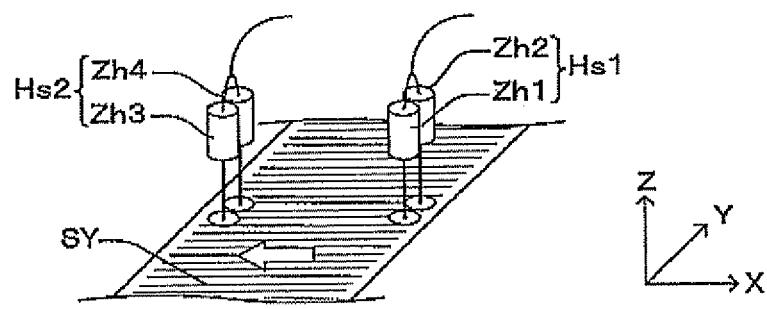
FIGS. 10A and 10B are views used to explain a first and second modified example of the surface position measurement system, respectively.
Figure 10B:
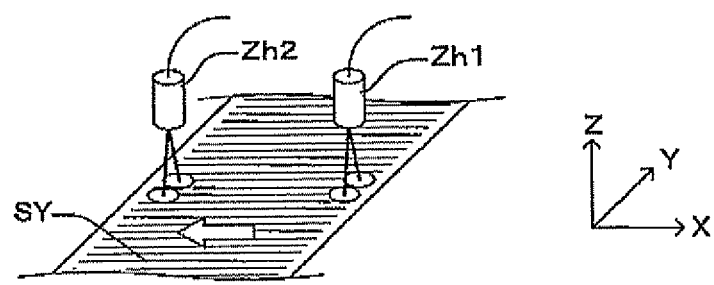

As a first modified example, two heads, which are a priority head and an auxiliary head, can be made into a set (to be referred to as a head set), and an example where at least one set is constantly made to f ace the scale can be given. In this first modified example, as shown in FIG. 10A, a head set Hs1 consisting of two Z heads Zh1 and Zh2 placed close to the longitudinal direction (the Y-axis direction) of scale SY, and another head set Hs2 consisting of two Z heads Zh3 and Zh4 placed close to the Y-axis direction face one scale, SY. In this first modified example, a plurality of head sets is prepared, configured of two Z heads in proximity to the Y-axis direction, and these head sets are placed in parallel with the X-axis direction at a distance smaller than the effective width of scale SY. Accordingly, one head set will constantly face scale SY.

When scale SY (more specifically, the wafer stage) moves in the −X direction from the state shown in FIG. 10A, head set Hs1 moves off of scale SY. To be more precise, irradiation points of measurement beams outgoing from the two heads Zh1 and Zh2 constituting head set Hs1, or more specifically, measurement points of heads Zh1 and Zh2 move off from an effective area of scale SY. Therefore, before head set Hs1 moves off from scale SY, main controller 20 switches the head set controlling the stage position from head set Hs1 to head set Hs2.

This first modified example is effective to abnormality of the measurement values due to abnormality in the scales previously described, and is also effective to abnormality of the measurement values due to malfunction of the heads.

A second modified example following the first modified example described above is shown in FIG. 10B. In the embodiment and the first modified example described above, a configuration of a Z head has been employed where one measurement beam from one head is irradiated on a scale, and the surface position (Z position) of the scale at the irradiation point (that is, Measurement point) is measured, whereas in the second modified example, a configuration of a Z head which can perform two-point measurement has been employed where two measurement beams are irradiated on a scale from one head, and the Z position at each irradiation point is measured. Accordingly, in the second modified example, Z head Zh1 (Zh2) shown in FIG. 10B functions in the same manner as head set Hs1 (headset Hs2 configured of heads Hs3 and Hs4) configured of Z heads Zh1 and Zh2 as shown in FIG. 10A in the first modified example.

Accordingly, also in the second modified example, a plurality of Z heads which can perform two-point measurement is placed parallel to the X-axis direction, at a distance smaller than the effective width of scale SY as in the first modified example. Accordingly, one Z head will constantly face scale SY, and from the Z head, two measurement beams will be constantly irradiated on scale SY. Therefore, the first modified example is similar to the second modified example, including the procedure of the switching process, except for the point that the concept of a head set configured of a priority head and an auxiliary head is replaced to a concept of a measurement beam set configured of a priority measurement beam and an auxiliary measurement beam.

In the first and second modified examples described above, the two Z heads configuring the head set, or the two measurement points that make a set is placed in parallel in the longitudinal direction (the Y-axis direction) of the scale. In correspondence with these examples, an example can also be considered where the placement is in parallel in a direction (the X-axis direction) orthogonal to the longitudinal direction of the scale.

Figure 11A:
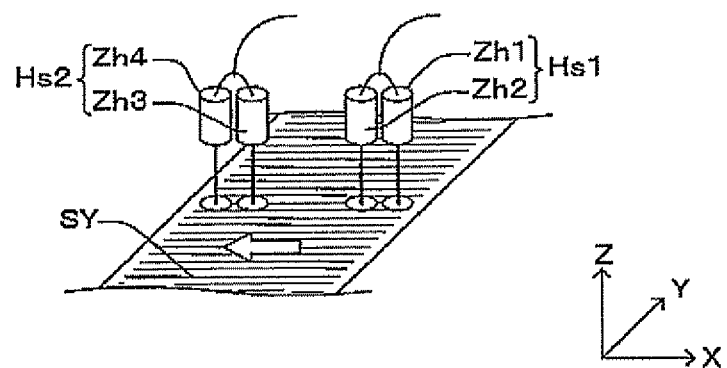
FIGS. 11A and 11B are views used to explain a third and fourth modified example of the surface position measurement system, respectively.

FIG. 11A shows a third modified example, in correspondence with the first modified example in FIG. 10A. In the third modified example, similar to the first modified example, two heads, which are a priority head and a auxiliary head, are made into a set, and at least one set is constantly made to face the scale. However, in FIG. 11A, it is different from the first modified example, and a head set Hs1 consisting of two heads Zh1 and Zh2 placed close to the effective width direction (the X-axis direction) of scale SY, and another head set Hs2 consisting of two heads Zh3 and Zh4 placed close to the X-axis direction face one scale, SY. In this third modified example, a plurality of head sets is prepared, configured of two Z heads in proximity to the X-axis direction, and these head sets are placed in parallel with the X-axis direction so that one head set constantly faces scale SY. However, the distance of two adjacent head sets, is set to a distance so that the irradiation points (measurement points) of the measurement beams outgoing from (all four heads configuring) the two head sets are located within the effective area of scale SY, as shown in FIG. 11A.

When scale SY (more specifically, the wafer stage) moves in the −X direction from a state shown in FIG. 11A, the measurement point of Z head Zh1 moves off from the effective area of scale SY. It, supposing that Z head Zh1 was chosen as the priority head of head set Hs1, the main controller 20 switches the priority head to Z head Zh2 at a point in time when Z head Zh1 moves off from scale SY. Furthermore, when scale SY moves in the −X direction, then the measurement point of head Zh2 moves off from scale SY. Therefore, by this point in time at the latest, or more specifically, before the measurement point of both heads Zh1 and ZhZ configuring head set Hs1 moves off from scale SY, the head set controlling the stage position is switched from head set Hs1 to head set Hs2.

This third modified example is effective to abnormality of the measurement values due to abnormality in the scales previously described, as well as effective to abnormality of the measurement values due to malfunction of the heads, as in the first modified example.

A fourth modified example following the third modified example described above is shown in FIG. 11B. In the third modified example, a configuration of a Z head has been employed where one measurement beam from one head is irradiated on a scale, and the surface position (the Z position) of the scale at the irradiation point (that is, measurement point) is measured, whereas in the fourth modified example, a configuration of a Z head which can perform two-point measurement has been employed where two measurement beams are irradiated on a scale by one head, and the Z position at each irradiation point is measured, similar to the second modified example. Accordingly, Z head Zh1 (Zh2) in the fourth modified example shown in FIG. 11B functions in the same manner as head set Hs1 (headset Hs2 configured of heads Zh3 and Zh4) configured of Z heads Zh1 and Zh2 in FIG. 11A.

Figure 11B:
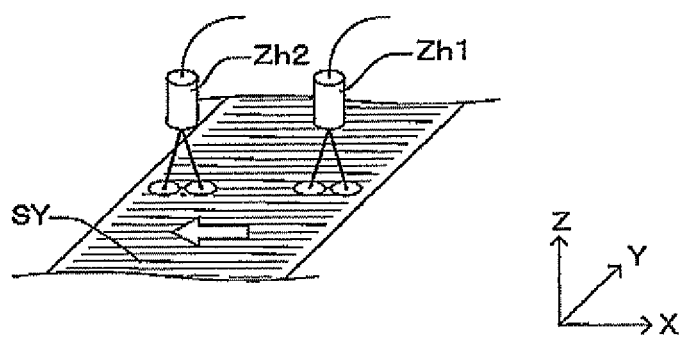

Accordingly, also in the fourth modified example, a plurality of Z heads which can measure two points in proximity is prepared, placed in parallel to the X-axis direction with one Z head constantly facing scale SY, or more specifically, so that the two measurement beams irradiate scale SY, as in the third modified example. However, the distance between adjacent Z heads is set so that all tour measurement beams of the two heads Zh1 and Zh2 are irradiated within the effective area of scale SY, as shown in FIG. 11B. Therefore, the third modified example is similar to the fourth modified example, including the processing of the switching process, except for the point that the concept of a head set configured of a priority head and an auxiliary head is replaced to a concept of a measurement beam set configured of a priority measurement beam and an auxiliary measurement beam.

Further, in the third modified example in FIG. 11A, the distance of two adjacent head sets, was set to a distance so that the irradiation points (measurement points) of the measurement beams outgoing from (all four heads configuring) the two head sets were located within the effective area of scale SY. However, by reason of the switching process of the headset, the placement distance of the two adjacent headsets can be set to a placement distance in which the two Z heads (Zh3, Zh4) configuring one head set (Hs2) and one of the Z heads (Zh2) of the two heads (Zh1, Zh2) configuring the other head set (Hs1), or three Z heads (Zh2, Zh3, and Zh4), face scale SY, as shown in FIG. 12.

Figure 12A:
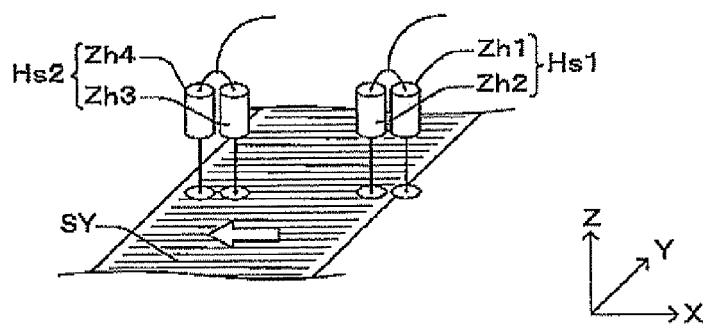
FIGS. 12A and 12B are views used to explain other modified examples of the surface position measurement system.
Figure 12B:
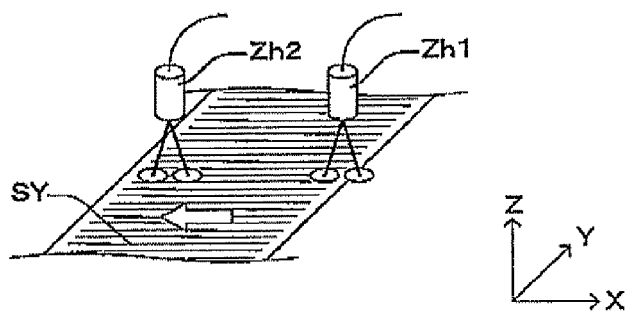

Similarly, also in the fourth modified example in FIG. 11B, the placement distance of the Z heads which can perform two-point measurement can be set at a placement distance so that three beams, which are, two measurement beams of one of the Z heads (Zh2) and one of the measurement beams of the other Z head (Zh1), are irradiated on scale SY, as shown in FIG. 12S.

Incidentally, in the first and third modified examples, while a head set consisting of one priority head and one auxiliary head was used, the number of auxiliary heads is not limited to one, and a plurality of auxiliary heads can be arranged. Further, in the second and fourth modified examples, while a Z head was employed having a configuration of emitting a total of two measurement beams, which are a priority measurement beam and an auxiliary measurement beam, a Z head having a configuration of emitting three or more measurement beams, which are the priority measurement beam and a plurality of auxiliary measurement beams, can also be employed. In the case of employing such a configuration, reliability of the measurement results improves because more measurement data can be detected. Further, in the case the plurality of heads within the head set are observed to be at the same position in the transverse direction (the X-axis direction in the modified examples) of the scale as in the four modified examples, priority cannot be given according to the guidelines such as, "priority given to the head which becomes effective first," or "priority given to the head closer to the scale center." Accordingly, it is desirable to decide a fixed priority order in the headset in advance.

Incidentally, the configuration of each measurement device such as the surface position measurement system described in the embodiment above is only an example, and it is a matter of course that the present invention is not limited to this. For example, in the embodiment above, an example has been described where the surface position measurement system is employed that has a configuration where a reflection surface (a Y scale) is arranged on a wafer table (a wafer stage), and Z heads facing the reflection surface are placed external to the wafer stage, however, the present invention is not limited to this, and a surface position measurement system that has a configuration where the Z heads are arranged on the wafer stage and the reflection surface is placed external to the wafer stage can also be, employed. In this case, at least two Z heads can be arranged on a plurality of places on the wafer stage, for example, on the four corners, and with one of the at least two Z heads serving as a priority head and the remaining at least one Z head serving as an auxiliary head, position control of the wafer stage can be performed similarly as in the embodiment and the modified examples above. Incidentally, the at least two Z heads can be placed in proximity on the wafer stage, or can be placed a predetermined distance apart. Especially in the latter case, the Z heads can be placed along a radiation direction from the center of the wafer stage.

Further, because the reflection surface arranged external to the wafer stage faces downward, it is considered that the liquid of the liquid immersion area will not remain and foreign materials such as dust and the like will not adhere on the surface.

Further, in the embodiment and the modified examples above, while the case has been described where the encoder head and the Z head were separately arranged, every encoder head can have a Z head, or each encoder head can be equipped with a Z head, or each encoder head can be a head (sensor) that can perform position detection in two directions, which are the X-axis or Y-axis direction, and the Z-axis direction. Especially in the former case, the encoder head and the Z head can be integrally arranged.

Further, in the embodiment and the modified examples above, when abnormality occurs in the measurement values of the priority head due to at least one of abnormality of the scale and malfunction of the head, the auxiliary head can, be used. In this case, in the embodiment and the modified examples above, malfunction (abnormality) of the encoder head includes gradient of the head or loss of telecentricity, besides mechanical failure. Further, in the case of the type of surface position system which has a head arranged on the stage and a reflection surface arranged above the head, the case when foreign materials (including, for example, the liquid for liquid immersion) adhere on the head is included in the abnormality (malfunction) of the encoder head. Further, not only in the case when the position becomes unmeasurable, but the case when the measurement accuracy exceeds a permissible value (the output (intensity) of the head results to be outside the permissible range) is also included in the abnormality of the head.

Further, in the embodiment above, while the case has been described where head units 62A and 62C each are equipped with nine Z heads, the number is not an issue as long as there are two or more Z heads which can simultaneously face a pair of reflection surfaces (in the embodiment above, Y scales $39Y_1$ and $39Y_2$) arranged on both sides of projection units.

Further, because rotation information in the θy direction of wafer table WTB (wafer stage WST) can also be measured using Z interferometers 43A and 43B, or X interferometer 126, the Z head can be arranged in a plurality of numbers on either one of head units 62A or 62c. From a similar point, if the Y scale which is the measurement object of the Z head is used only for the purpose of measuring the Z position of wafer table WTB, only one of Y scales $39Y_1$ and $39Y_2$ arranged is enough. Further, as the measurement object of the Z head, instead of Y scales $39Y_1$ and $39Y_2$, an exclusive reflection surface can be formed on the upper surface of wafer table WTB.

Further, in the embodiment above, while the case has been described where Z heads 74 and 76 were placed avoiding nozzle unit 32 and the like configuring a part of the liquid immersion system, in the case a plurality of sensor heads are arranged in a straight line parallel to the X-axis, it is desirable to at least move some sensor heads from the straight line in order to avoid the structures that are located on the straight line. As such a structure, besides projection optical unit PU and its peripheral members, at least a part of multipoint AF system (90*a*, 90*b*), or at least a part of alignment systems AL1 and AL2, can be representatively given. In the embodiment above, Z heads 72*a* to 72*d* are placed, avoiding multipoint AF system (90*a*, 90*b*).

Incidentally, in the embodiment above, while the lower surface of nozzle unit 32 and the lower end surface of the tip optical element of projection optical system PL were substantially flush, as well as this, for example, the lower surface of nozzle unit 32 can be placed nearer to the image plane (more specifically, to the wafer) of projection optical system PL than the outgoing surface of the tip optical element. That is, the configuration of local liquid immersion device 8 is not limited to the configuration described above, and the configurations which are described in, for example, EP Patent Application Publication No. 1420298, U.S. Patent Application Publication 2006/0231206, U.S. Patent Application Publication 2005/0280791, and U.S. Pat. No. 6,952,253 and the like can also be used. Further, as disclosed in, for example, U.S. Patent Application Publication No. 2005/0248856, the optical path on the object plane side of the tip optical element can also be filled with liquid, in addition to the optical path on the image plane side of the tip optical element. Furthermore, a thin film that is lyophilic and/or has dissolution preventing function may also be formed on the partial surface (including at least a contact surface with liquid) or the entire surface of the tip optical element. Incidentally, quartz has a high affinity for liquid, and also needs no dissolution preventing film, while in the case of fluorite, at least a dissolution preventing film is preferably formed.

Incidentally, in the embodiment above, pure water (water) was used as the liquid, however, it is a matter of course that the present invention is not limited to this. As the liquid, a chemically stable liquid that has high transmittance to illumination light IL and is safe to use, such as a fluorine-containing inert liquid can be used. As the fluorine-containing inert liquid, for example, Fluorinert (the brand name of 3M United States) can be used. The fluorine-containing inert liquid is also excellent from the point of cooling effect. Further, as the liquid, liquid which has a refractive index higher than pure water (a refractive index is around 1.44), for example, liquid having a refractive index equal to or higher than 1.5 can be used. As this type of liquid, for example, a predetermined liquid having C—H binding or O—H binding such as isopropanol having a refractive index of about 1.50, glycerol (glycerin) having a refractive index of about 1.61, a predetermined liquid (organic solvent) such as hexane, heptane or decane, or decalin (decahydronaphthalene) having a refractive index of about 1.60, or the like can be cited. Alternatively, a liquid obtained by mixing arbitrary two or more of these liquids may be used, or a liquid obtained by adding (raising) at least one of these liquids to (with) pure water may be used. Alternatively, as the liquid, a liquid obtained by adding (mixing) base or acid such as $H^+$, $Cs^+$, $K^+$, $Cl^-$, $SO_4^{2-}$ or $PO_4^{2-}$ to (with) pure water can be used. Moreover, a liquid obtained by adding (mixing) particles of Al oxide or the like to (with) pure water can be used. These liquids can transmit ArF excimer laser light. Further, as the liquid, liquid, which has a small absorption coefficient of light, is less temperature-dependent, and is stable to a projection optical system (tip optical member) and/or a photosensitive agent (or a protection film (top coat film), an antireflection film, or the like) coated on the surface of a wafer, is preferable. Further, in the case an F2 laser is used as the light source, fomblin oil can be selected. Further, as the liquid, a liquid having a higher refractive index to illumination light IL than that of pure water, for example, a refractive index of around 1.6 to 1.8 may be used. As the liquid, super-critical fluid can also be used. Further, the tip optical element of projection optical system PL may be formed by quartz (silica), or single-crystal materials of fluoride compound such as calcium fluoride (fluorite), barium fluoride, strontium fluoride, lithium fluoride, and sodium fluoride, or may be formed by materials having a higher refractive index than that of quartz or fluorite (for example, equal to or higher than 1.6). As the materials having a refractive index equal to or higher than 1.6, for example, sapphire, germanium dioxide, or the like disclosed in the pamphlet of International Publication No. 2005/059617, or kalium chloride (having a refractive index of about 1.75) or the like disclosed in the pamphlet of International Publication No. 2005/059618 can be used.

Further, in the embodiment above, the recovered liquid may be reused, and in this case, a filter that removes impurities from the recovered liquid is preferably arranged in a liquid recovery unit, a recovery pipe or the like.

Further, in the embodiment above, the case has been described where the exposure apparatus is a liquid immersion type exposure apparatus. However, the present invention is not limited to this, but can also be employed in a dry type exposure apparatus that performs exposure of wafer W without liquid (water).

Further, in the embodiment above, the case has been described where the present invention is applied to a scanning exposure apparatus by a step-and-scan method or the like. However, the present invention is not limited to this, but may also be applied to a static exposure apparatus such as a stepper. Even in the case of a stepper, because the position of the stage on which the object subject to exposure is mounted can be measured using an encoder as in the embodiment described above, a similar effect can be obtained. Further, the present invention can also be applied to a reduction projection exposure apparatus by a step-and-stitch method that synthesizes a shot area and a shot area, an exposure apparatus by a proximity method, a mirror projection aligner, or the like. Moreover, the present invention can also be applied to a multi-stage type exposure apparatus equipped with a plurality of wafer stages, as is disclosed in, for example, the U.S. Pat. No. 6,590,634, the U.S. Pat. No. 5,969,441, the U.S. Pat. No. 6,208,407 and the like.

Further, the magnification of the projection optical system in the exposure apparatus of the embodiment above is not only a reduction system, but also may be either an equal magnifying system or a magnifying system, and projection optical system PL is not only a dioptric system, but also may be either a catoptric system or a catadioptric system, and in addition, the projected image may be either an inverted image or an upright image. Further, the illumination area and exposure area described above are to have a rectangular shape. However, the shape is not limited to rectangular, and can also be circular arc, trapezoidal, parallelogram or the like.

Incidentally, a light source of the exposure apparatus in the embodiment above is not limited to the ArF excimer laser, but a pulse laser light source such as a KrF excimer laser (output wavelength: 248 nm), an $F_2$ laser (output wavelength: 157 nm), an $Ar_2$ laser (output wavelength: 12 nm) or a Kr2 laser (output wavelength: 146 nm), or an extra-high pressure mercury lamp that generates an emission line such as a g-line (wavelength: 436 nm), an i-line (wavelength: 365 nm) and the like can also be used. Further, a harmonic wave generating unit of a YAG laser or the like can also be used. Besides the sources above, as is disclosed in, for example, U.S. Pat. No. 7,023,610, a harmonic wave, which is obtained by amplifying a single-wavelength laser beam in the infrared or visible range emitted by a DFB semiconductor laser or fiber laser as vacuum ultraviolet light, with a fiber amplifier doped with, for example, erbium (or both erbium and ytteribium), and by converting the wavelength into ultraviolet light using a non-linear optical crystal, can also be used.

Further, in the embodiment above, illumination light IL of the exposure apparatus is not limited to the light having a wavelength equal to or more than 100 nm, and it is needless to say that the light having a wavelength less than 100 nm can be used. For example, in recent years, in order to expose a pattern equal to or less than 70 nm, an EUV exposure apparatus that makes an SOR or a plasma laser as a light source generate an EUV (Extreme Ultraviolet) light in a soft X-ray range (e.g. a wavelength range from 5 to 15 nm), and uses a total reflection reduction optical system designed under the exposure wavelength (for example, 13.5 nm) and the reflective mask has been developed. In the EUV exposure apparatus, the arrangement in which scanning exposure is performed by synchronously scanning a mask and a wafer using a circular arc illumination can be considered, and therefore, the present invention can also be suitably applied to such an exposure apparatus. Besides such an apparatus, the present invention can also be applied to an exposure apparatus that uses charged particle beams such as an electron beam or an ion beam.

Further, in the embodiment above, a transmissive type mask (reticle) is used, which is a transmissive substrate on which a predetermined light shielding pattern (or a phase pattern or a light attenuation pattern) is formed. Instead of this reticle, however, as is disclosed in, for example, U.S. Pat. No. 6,778,257, an electron mask (which is also called a variable shaped mask, an active mask or an image generator, and includes, for example, a DMD (Digital Micromirror Device) that is a type of a non-emission type image display device (spatial light modulator) or the like) on which a light-transmitting pattern, a reflection pattern, or an emission pattern is formed according to electronic data of the pattern that is to be exposed can also be used.

Further, for example, the present invention can also be applied to an exposure apparatus (lithography system) that forms line-and-space patterns on a wafer by forming interference fringes on the wafer.

Moreover, as disclosed in, for example, U.S. Pat. No. 6,611,316, the present invention can also be applied to an exposure apparatus that synthesizes two reticle patterns via a projection optical system and almost simultaneously performs double exposure of one shot area by one scanning exposure.

Further, an apparatus that forms a pattern on an object is not limited to the exposure apparatus (lithography system) described above, and for example, the present invention can also be applied to an apparatus that forms a pattern on an object by an ink-jet method.

Incidentally, an object on which a pattern is to be formed (an object subject to exposure to which an energy bean is irradiated) in the embodiment above is not limited to a wafer, but may be other objects such as a glass plate, a ceramic substrate, a film member, or a mask blank.

The use of the exposure apparatus is not limited only to the exposure apparatus for manufacturing semiconductor devices, but the present invention can also be widely applied, for example, to an exposure apparatus for transferring a liquid crystal display device pattern onto a rectangular glass plate, and an exposure apparatus for producing organic ELs, thin-film magnetic heads, imaging devices (such as CCDs), micro-machines, DNA chips, and the like. Further, the present invention can be applied not only to an exposure apparatus for producing microdevices such as semiconductor devices, but can also be applied to an exposure apparatus that transfers a circuit pattern onto a glass plate or silicon wafer to produce a mask or reticle used in a light exposure apparatus, an EUV exposure apparatus, an X-ray exposure apparatus, an electron-beam exposure apparatus, and the like.

Incidentally, the disclosures of the various publications, the pamphlets of the International Publications, and the U.S. patent application Publication descriptions and the U.S. patent descriptions that are cited in the embodiment above and related to exposure apparatuses and the like are each incorporated herein by reference.

Electronic devices such as semiconductor devices are manufactured through the steps of; a step where the function/performance design of the device is performed, a step where a reticle based on the design step is manufactured, a step where a wafer is manufactured from silicon materials, a lithography step where the pattern of a reticle is transferred onto the wafer by the exposure apparatus (pattern formation apparatus) in the embodiment previously described, a development step where the wafer that has been exposed is developed, an etching step where an exposed member of an area other than the area where the resist remains is removed by etching, a resist removing step where the resist that is no longer necessary when etching has been completed is removed, a device assembly step (including a dicing process, a bonding process, the package process), inspection steps and the like. In this case, in the lithography step, because the device pattern is formed on the wafer by executing the exposure method previously described using the exposure apparatus of the embodiment, a highly integrated device can be produced with good productivity.

While the above-described embodiments of the present invention are the presently preferred embodiments thereof those skilled in the art of lithography systems will readily recognize that numerous additions, modifications, and substitutions may be made to the above-described embodiments without departing from the spirit and scope thereof. It is intended that all such modifications, additions, and substitutions fall within the scope of the present invention, which is best defined by the claims appended below.

What is claimed is:

1. A movable body apparatus including a movable body which substantially moves along a predetermined plane, the apparatus comprising:

a reflection surface which is arranged at one of the movable body and an outside of the movable body, with a first direction within a plane parallel to the predetermined plane serving as a longitudinal direction, the reflection surface having a predetermined width in a second direction orthogonal to the first direction within the plane parallel to the predetermined plane;

a measurement device which has a plurality of measurement points placed in a movement area of the movable body, and measures positional information of the reflection surface in a third direction orthogonal to the predetermined plane by irradiating measurement beams on the measurement points placed on the reflection surface within the predetermined width; and a controller which performs position control of the movable body, preferentially using a first measurement information including measurement information at a first measurement point out of n (wherein n is an integer of two or more) or more measurement points positioned within the predetermined width of the reflection surface, and which switches measurement information to preferentially use in position control of the movable body to a second measurement information including measurement information at a second measurement point different from the first measurement point when abnormality occurs in the first measurement information at the first measurement point due to abnormality of the reflection surface, wherein the controller determines whether the abnormality has occurred by comparing the first measurement information with a threshold.

2. The movable body apparatus according to claim 1 wherein each of the first measurement information and the second measurement information includes measurement information at a plurality of measurement points.

3. The movable body apparatus according to claim 1 wherein each of the first measurement information and the second measurement information is measurement information at a single measurement point.

4. The movable body apparatus according to claim 1 wherein the measurement device has a head which irradiates a measurement beam on the measurement point, and the head irradiates the measurement beam on the n or more measurement points of the plurality of measurement points.

5. The movable body apparatus according to claim 1 wherein the reflection surface includes a pair of parts separated from each other in the second direction, and the measurement points are set so that n or more measurement points are constantly positioned in at least one of the pair of parts of the reflection surface when the movable body is in the predetermined range within the predetermined plane.

6. The movable body apparatus according to claim 1 wherein the measurement device has a first head and a second head which irradiate measurement beams on the same measurement point, and an irradiation area of the measurement beam irradiated from the first head is in proximity with an irradiation area of the measurement beam irradiated by the second head, without overlapping.

7. The movable body apparatus according to claim 1, wherein the measurement points are substantially equally spaced from each other in the second direction by half or less than half of the predetermined width of the reflection surface.

8. A pattern formation apparatus that forms a pattern on an object, the apparatus comprising:

a patterning device which forms a pattern on the object; and the movable body apparatus according to claim 1 in which the object is mounted on the movable body.

9. The pattern formation apparatus according to claim 8 wherein the object has a sensitive layer, and the patterning device forms a pattern on the object by exposing the sensitive layer.

10. An exposure apparatus that forms a pattern on an object by irradiating an energy beam, the apparatus comprising:

a patterning device that irradiates the energy beam on the object;

the movable body apparatus according to claim 1 in which the object is mounted on the movable body; and a controller which drives the movable body to make the object relatively move with respect to the energy beam.

11. A device manufacturing method comprising:

forming a pattern on an object with the exposure apparatus according to claim 10; and developing the object on which the pattern has been formed.

* * * * *